United States Patent
Nishikawa et al.

(10) Patent No.: US 11,437,243 B2
(45) Date of Patent: Sep. 6, 2022

(54) MASK MATERIAL FOR PLASMA DICING, MASK-INTEGRATED SURFACE PROTECTIVE TAPE AND METHOD OF PRODUCING SEMICONDUCTOR CHIP

(71) Applicant: FURUKAWA ELECTRIC CO., LTD., Tokyo (JP)

(72) Inventors: Takuya Nishikawa, Tokyo (JP); Akira Akutsu, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/440,490

(22) Filed: Jun. 13, 2019

(65) Prior Publication Data

US 2019/0295851 A1    Sep. 26, 2019

Related U.S. Application Data

(63) Continuation of application No. PCT/JP2018/038302, filed on Oct. 15, 2018.

(30) Foreign Application Priority Data

Oct. 18, 2017  (JP) .............................. JP2017-202234

(51) Int. Cl.
*H01L 21/30* (2006.01)
*H01L 21/68* (2006.01)
(Continued)

(52) U.S. Cl.
CPC ........ *H01L 21/3065* (2013.01); *B23K 26/351* (2015.10); *H01L 21/6836* (2013.01); *H01L 21/82* (2013.01)

(58) Field of Classification Search
CPC . H01L 21/3065; H01L 21/6836; H01L 21/82; H01L 21/30655; H01L 21/31138;
(Continued)

(56) References Cited

U.S. PATENT DOCUMENTS 6,940,181 B2 * 9/2005 Derderian .......... H01L 21/6835
216/11
10,307,866 B2  6/2019 Yokoi et al.
(Continued)

FOREIGN PATENT DOCUMENTS

JP    2007-19385 A    1/2007
JP    2007-123404 A   5/2007
(Continued)

OTHER PUBLICATIONS

Japanese Office Action for Japanese Application No. 2017-202234, dated Apr. 7, 2020, with machine English translation.
(Continued)

*Primary Examiner* — Sheikh Maruf
(74) *Attorney, Agent, or Firm* — Birch, Stewart, Kolasch & Birch, LLP

(57) ABSTRACT

A mask material for plasma dicing, which is used in a plasma step, whose surface roughness Rz at the surface side that does not touch with an adherend is from 0.1 μm to 1.5 μm;
a mask-integrated surface protective tape; and
a method of producing a semiconductor chip.

8 Claims, 6 Drawing Sheets

(51) Int. Cl.
- *H01L 21/3065* (2006.01)
- *B23K 26/351* (2014.01)
- *H01L 21/683* (2006.01)
- *H01L 21/82* (2006.01)

(58) Field of Classification Search
CPC ........... H01L 21/31127; H01L 21/3081; H01L 2221/68327; H01L 2221/6834; H01L 2221/68381; H01L 21/78; H01L 21/308; H01L 21/67069; H01L 21/67092; H01L 21/67132; H01L 21/76; B23K 26/351; C09J 7/385; C09J 2203/326; C09J 2301/208; C09J 2301/312; C09J 2423/006
USPC ....................................................... 438/460
See application file for complete search history.

(56) References Cited

U.S. PATENT DOCUMENTS

| | | | | |
|---|---|---|---|---|
| 2002/0055238 A1* | 5/2002 | Sugino | H01L 21/78 | 438/459 |
| 2005/0218479 A1* | 10/2005 | Park | H01L 24/32 | 257/620 |
| 2006/0009008 A1* | 1/2006 | Kaneuchi | H01L 21/6836 | 438/463 |
| 2006/0024924 A1* | 2/2006 | Haji | H01L 21/6836 | 438/464 |
| 2007/0272666 A1* | 11/2007 | O'Brien | B23K 26/40 | 219/121.69 |
| 2008/0242053 A1* | 10/2008 | Lee | H01L 21/6836 | 438/463 |
| 2009/0004780 A1* | 1/2009 | Arita | H01L 21/78 | 438/114 |
| 2009/0020511 A1* | 1/2009 | Kommera | B23K 26/0622 | 219/121.68 |
| 2009/0042368 A1* | 2/2009 | Sekiya | H01L 21/3065 | 438/460 |
| 2010/0013036 A1* | 1/2010 | Carey | H01L 21/268 | 257/431 |
| 2010/0048001 A1* | 2/2010 | Harikai | H01J 37/32743 | 438/464 |
| 2010/0055875 A1* | 3/2010 | Haji | B23K 26/40 | 438/463 |
| 2010/0120227 A1* | 5/2010 | Grivna | H01L 21/78 | 438/462 |
| 2010/0120230 A1* | 5/2010 | Grivna | H01L 21/78 | 438/464 |
| 2010/0173474 A1* | 7/2010 | Arita | H01L 21/6836 | 438/462 |
| 2010/0216313 A1* | 8/2010 | Iwai | H01L 21/6831 | 438/729 |
| 2010/0246611 A1* | 9/2010 | Sun | B23K 26/0622 | 372/18 |
| 2010/0279150 A1* | 11/2010 | Hatta | B32B 17/10761 | 428/704 |
| 2011/0008552 A1* | 1/2011 | Umemoto | C09J 133/02 | 428/1.5 |
| 2012/0007244 A1* | 1/2012 | Harrison | H01L 21/02057 | 257/E23.012 |
| 2012/0108733 A1* | 5/2012 | Suwa | C09J 7/24 | 524/555 |
| 2012/0322237 A1* | 12/2012 | Lei | B23K 26/40 | 438/462 |
| 2013/0230971 A1* | 9/2013 | Geerpuram | H01L 21/30655 | 438/460 |
| 2014/0038389 A1* | 2/2014 | Kobayashi | H01L 27/14618 | 438/460 |
| 2014/0127880 A1* | 5/2014 | Grivna | H01L 21/3065 | 438/458 |
| 2014/0154869 A1* | 6/2014 | Geerpuram | H01L 21/68735 | 438/460 |
| 2014/0235034 A1* | 8/2014 | Pays-Volard | H01L 21/68735 | 438/460 |
| 2014/0242780 A1* | 8/2014 | Gauldin | H01L 21/6836 | 438/463 |
| 2015/0332970 A1* | 11/2015 | Lei | H01L 21/6836 | 438/462 |
| 2016/0141209 A1* | 5/2016 | Takano | H01L 21/3065 | 438/464 |
| 2017/0033008 A1* | 2/2017 | Martinez | H01L 21/68771 | |
| 2017/0229384 A1* | 8/2017 | Harikai | H01L 21/3081 | |
| 2018/0012788 A1* | 1/2018 | Oka | H01L 21/78 | |
| 2018/0151435 A1* | 5/2018 | Chiang | H01L 21/6831 | |
| 2018/0185964 A1* | 7/2018 | Yokoi | C09J 7/20 | |
| 2019/0107657 A1* | 4/2019 | Jung | C09J 133/066 | |
| 2019/0109047 A1* | 4/2019 | Goto | H01L 21/78 | |
| 2019/0295851 A1* | 9/2019 | Nishikawa | H01L 21/78 | |
| 2019/0295894 A1* | 9/2019 | Okita | H01L 21/78 | |
| 2019/0371618 A1* | 12/2019 | Uchiyama | H01L 21/31133 | |
| 2020/0051862 A1* | 2/2020 | Piao | H01L 21/67132 | |
| 2020/0091000 A1* | 3/2020 | Seddon | H01L 21/561 | |

FOREIGN PATENT DOCUMENTS

| | | | |
|---|---|---|---|
| JP | 2015-5696 A | | 1/2015 |
| JP | 2015005696 A | * | 1/2015 |
| JP | 2016-21491 A | | 2/2016 |
| JP | 2016021491 A | * | 2/2016 |
| WO | WO 2017/082210 A1 | | 5/2017 |
| WO | WO 2017/170438 A1 | | 5/2017 |

OTHER PUBLICATIONS

Korean Office Action dated Jul. 14, 2020 for Application No. 10-2019-7008983 with an English translation.

International Search Report (PCT/ISA/210) issued in PCT/JP2018/038302, dated Dec. 11, 2018.

Korean Notification of Reason for Refusal for Korean Application No. 10-2019-7008983, dated Mar. 10, 2021, with an English translation.

* cited by examiner

MASK MATERIAL FOR PLASMA DICING, MASK-INTEGRATED SURFACE PROTECTIVE TAPE AND METHOD OF PRODUCING SEMICONDUCTOR CHIP

CROSS-REFERENCE TO RELATED APPLICATIONS

This application is a Continuation of PCT International Application No. PCT/JP2018/038302 filed on Oct. 15, 2018, which claims priority under 35 U.S.C. § 119 (a) to Japanese Patent Application No. 2017-202234 filed in Japan on Oct. 18, 2017. Each of the above application is hereby expressly incorporated by reference, in its entirely, into the present application.

TECHNICAL FIELD

The present invention relates to mask material for plasma dicing, a mask-integrated surface protective tape and a method of producing a semiconductor chip

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained, by thinning a semiconductor wafer to a predetermined thickness in a backgrinding step, an etching step or the like, and then dividing the semiconductor wafer into individual chips through a dicing step.

In the past, a blade dicing method of cutting the semiconductor wafer with a dicing blade has been used. However, in this blade dicing method, the cutting resistance by the blade is put directly on the semiconductor wafer at the time of cutting, so that a microscopic crack (or chipping) sometimes occurs in the semiconductor chips by this cutting resistance. Occurrence of the chipping does not only deteriorate outer appearance of the semiconductor chips, but also in some cases, there is a risk that even a circuit pattern on the chips is damaged, for example, a damage of chips is occurred due to lack (or insufficiency) of the transverse strength (or deflective strength) at the time of picking up. Further, in the foregoing physical dicing step using such a blade, it is impossible to set the width of a kerf (also referred to as a scribe line or a street) which is an interval between chips to less than the thick blade width. As a result, the number (yield) of chips gotten from a sheet of wafer decreases. Further, a long time period to be taken for the processing of the wafer is also a problem.

Therefore, in the dicing step, use is also made of any of various kinds of methods, other than the blade dicing method. For example, there are representative methods that 1) a DBG (i.e. dicing before grinding) method of forming in first a groove with a predetermined thickness in the wafer, and then carrying out a grinding step, and thereby for achieving both the thinning and the singulation into chips at the same time, 2) a laser dicing method of carrying out a dicing step with a laser, 3) a method using a wet process, such as a water-jet method of carrying out a dicing step with a water pressure, 4) the stealth dicing method of forming a modifying layer with a laser in the thickness direction of the wafer, and then splitting the modifying layer by expansion to singulate the wafer, 5) a combined method of the stealth dicing and dicing before grinding, and the like.

These methods each individually have a merit. However, these methods have disadvantages such as breakage of the chip, a prolonged time required for production of the microchip, a surface contamination, restriction to narrowing of a kerf width, lowering of yield in the chip to be obtained, lowering of transverse strength of the chip, and crack of the chip corner caused by collision of an end-face of the chip with an adjacent chip.

In addition to the above methods, there is 6) a plasma dicing method (for example, see Patent Literature 1).

The plasma dicing method is a method of dividing a semiconductor wafer, by selectively etching a portion which is not covered with a mask, using plasma. When this dicing method is used, segmentation of chips can be achieved selectively, and even if the scribe line is curved, the segmentation is possible with no trouble. Further, as the etching rate is very high, in recent years, this dicing method is considered one of the most suitable steps for the segmentation into chips.

In the plasma dicing method, use is made of, as a plasma generating gas, a fluorine-based gas which has a very high reactivity with a wafer, such as sulfur hexafluoride ($SF_6$) and carbon tetrafluoride ($CF_4$). For this reason, a protection for a non-etched surface with a mask against such high etching rate is necessary. Therefore, a preliminary mask formation becomes necessary.

As the method of forming the mask, as described in Patent Literature 1, generally the technique is used which consists of: coating a resist on the surface of the wafer; and then removing the portion corresponding to a street by a photolithography, to form the mask. Therefore, in order to carry out the plasma dicing, it is required for a facility for the photolithographic step other than the plasma dicing facility. For this reason, there is a problem of increase in chip costs. Further, in the step of removing a mask by a laser irradiation to expose a scribe line, there was a problem that because a mask material did not absorb the laser well thereby reflecting or scattering the laser, the mask material could not be successfully removed.

CITATION LIST

Patent Literatures

Patent Literature 1: JP-A-2007-19385 ("JP-A" means unexamined published Japanese patent application)

SUMMARY OF INVENTION

Technical Problem

In view of the above-described problems, the present inventors studied on development of the mask material which absorbs laser well (is excellent in laser-absorbing capability) as a mask material used for plasma dicing thereby allowing removal of the mask without a residue in the mask removal step.

The use of the mask material according to the present invention allows production of a semiconductor chip through at least the following steps.

[Steps]

(A) An opening step of the street portion of the semiconductor wafer by a laser cutting for the surface exposed mask material layer (B) A plasma-dicing step (C) An ashing step of a remaining mask material layer The step (A) requires an easy and good peeling property between a mask material layer and a layer adjacent to this layer (in a case of having a temporary-adhesive layer, the adjacent layer is the temporary-adhesive layer, whereas in a case of having no temporary-adhesive layer, the adjacent layer is a substrate film or the like) after a thin-film processing of the wafer, and openability of the street of the semiconductor wafer with a high degree of precision which is achieved by cutting a portion of the mask material layer corresponding to the street of the semiconductor wafer with a laser. The step (B) requires a performance of protecting a wafer from irradiation plasma such as $SF_6$ plasma and the step (C) requires a removal performance of the mask material layer by irradiation plasma such as $O_2$ plasma. It has turned out to be a problem that if the substrate surface roughness is too rough, the mask material surface having contact with the substrate or the mask material surface provided through a temporary-adhesive layer becomes rough, so that in the step (A), the laser is scattered on the mask material surface and as a result, the opening of the street of the wafer does not go well, or a lot of residues remains. Further, it has turned out to be a problem that if the substrate surface roughness is too flat and smooth, when peeling a separator (this means a surface protective tape or a substrate film, having contact with the mask material layer), the mask material is pulled toward the separator side, so that the mask material is peeled from a wafer at the time of peeling the separator.

Accordingly, the present invention is contemplated to provide a mask material for plasma dicing, said mask material being used in production of a semiconductor chip using a plasma dicing method, and exhibiting an excellent performance in each of the production steps of the semiconductor chip, and achieving an excellent removal performance in the mask removal step.

In particular, the present invention is contemplated to provide a mask material that is excellent in any problems to overcome which are caused by providing a mask material layer, such as cutting and removability by laser opening and removability by a plasma ashing with $O_2$ and the like, and is contemplated to provide a mask-integrated surface protective tape having a mask material layer that is excellent in at least these performances and to provide a method of producing a semiconductor chip by using this mask-integrated surface protective tape.

Solution to Problem

The above-described problems of the present invention are solved by the following means.

(1) A mask material for plasma dicing, which is used in a plasma step, wherein the surface roughness Rz of the mask material at the surface side that does not touch with an adherend is from 0.1 μm to 1.5 μm.

(2) A mask-integrated surface protective tape, which is used in the production of a semiconductor chip, containing at least:

a substrate film, and a mask material layer provided on the substrate film, wherein the surface roughness Rz of the mask material layer at the surface side that does not touch with an adherend is from 0.1 μm to 1.5 μm.

(3) The mask-integrated surface protective tape described in the above item (2), wherein the mask material layer is provided directly on the substrate film, or is provided on the substrate film through a temporary-adhesive layer.

(4) The mask-integrated surface protective tape described in the above item (2) or (3), wherein the parallel ray absorption rate in the wavelength of 355 nm to 10800 nm of the mask material layer is 50% or more.

(5) The mask-integrated surface protective tape described in any one of the above items (2) to (4), wherein the mask material layer contains a resin and at least one kind of ultraviolet absorber, wherein the ultraviolet absorber is a compound having a skeleton selected from the group consisting of a triazine skeleton, a benzophenone skeleton, a benzotriazole skeleton and a benzoate skeleton, and wherein the content of the ultraviolet absorber in the mask material layer is from 0.5 to 1.5 parts by mass with respect to 100 parts by mass of the resin.

(6) The mask-integrated surface protective tape described in any one of the above items (2) to (4), wherein the mask material layer contains a (meth)acrylic polymer having an ultraviolet-absorbing skeleton.

(7) The mask-integrated surface protective tape described in any one of the above items (2) to (6), wherein the mask material layer is radiation-curable.

(8) The mask-integrated surface protective tape described in any one of the above items (2) to (6), wherein the mask material layer is provided on the substrate film through a temporary-adhesive layer, and wherein the temporary-adhesive that constitutes the temporary-adhesive layer is a pressure-sensitive type temporary-adhesive.

(9) The mask-integrated surface protective tape described in any one of the above items (2) to (8), wherein the substrate film contains at least a polyolefin-series resin layer.

(10) A method of producing a semiconductor chip which is using a mask-integrated surface protective tape having at least a substrate film and a mask material layer provided on the substrate film, wherein surface roughness Rz of the mask material layer at the surface side that does not touch with an adherend is from 0.1 μm to 1.5 μm, and wherein the method of producing a semiconductor chip contains the following steps (a) to (d):

[Steps]

(a) a step of, in the state of having laminated the mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;

(b) a step of, after peeling at least the substrate firm from the mask-integrated surface protective tape thereby to expose the mask material layer on top, forming an opening by cutting a portion of the mask material layer corresponding to a street of the semiconductor wafer with a laser;

(c) a plasma-dicing step of segmentalizing the semiconductor wafer on the street by a $SF_6$ plasma, and thereby for singulating the semiconductor wafer into semiconductor chips; and (d) a step of removing the mask material layer.

(11) The method of producing a semiconductor chip described in the above item (10), wherein the mask material layer is provided directly on the substrate film or provided on the substrate film a through a temporary-adhesive layer, and wherein in order to expose the mask material layer on top in the step (b), the substrate film is peeled or both the substrate film and the temporary-adhesive layer are integrally peeled.

Advantageous Effects of Invention

The present invention eliminates the need for a mask formation by a photolithography process in production of the semiconductor chip using a plasma dicing method. Further, by the present invention, provision of both a mask material that is excellent in removability by laser and a mask-integrated surface protective tape having a layer of this mask material became possible.

By this, provision of both a mask-integrated surface protective tape that exhibits excellent performances in each of production steps of the semiconductor chip and also that is excellent in both operability and activity, and a method of producing a semiconductor chip by using this mask-integrated surface protective tape became possible.

In particular, the mask material of the present invention is excellent in any problems to overcome that are caused by providing a mask material layer, such as a cutting property by a laser opening and removability by $O_2$ plasma ashing.

As a result, the mask-integrated surface protective tape using the mask material of the present invention allows prevention of the following problems particularly in the step of cutting a portion of the mask material corresponding to a street of a semiconductor wafer by laser, thereby to form an opening of the street of the semiconductor wafer. That is, this allows prevention of the problems such as reduction in laser processing efficiency due to lack of laser light absorption performance of the mask material layer and deterioration of wafer processing quality as a result of fusion of the mask material layer due to a prolonged time of the laser processing and an energy input (irradiation) of the excessive laser light.

BRIEF DESCRIPTION OF THE DRAWINGS

FIG. 1(a) shows a semiconductor wafer, fragmentary FIG. 1(b) shows how the mask-integrated surface protective tape is laminated onto the semiconductor wafer, and fragmentary FIG. 1(c) shows a semiconductor wafer on which the mask-integrated surface protective tape is laminated.

FIG. 2(a) shows thinning step of the semiconductor wafer, fragmentary FIG. 2(b) shows how a wafer-fixing tape is laminated to the thinning processed semiconductor wafer, and fragmentary FIG. 2(c) shows a state in which the semiconductor wafer is fixed to a ring flame.

FIG. 3(a) shows how the surface protective tape is peeled off from the mask-integrated surface protective tape while leaving the mask material layer, fragmentary FIG. 3(b) shows a state in which the mask material layer of the mask-integrated surface protective tape is exposed (uncovered), and fragmentary FIG. 3(c) shows a step of cutting off the mask material layer corresponding to the street with a laser.

FIG. 4(a) shows how the plasma dicing is carried out, fragmentary FIG. 4(b) shows a state in which the semiconductor wafer is singulated into chips, and fragmentary FIG. 4(c) shows how the plasma ashing is carried out.

FIG. 5(a) shows a state, in which the mask material layer is removed, and fragmentary FIG. 5(b) shows how the chip is picked up.

FIG. 6(a) shows a state in which both sides of the front and the back of the semiconductor wafer are covered and fixed with the mask-integrated surface protective tape and the wafer-fixing tape, respectively. Fragmentary FIG. 6(b) shows how an ultraviolet light is irradiated. Fragmentary FIG. 6(c) shows how the surface protective tape is peeled off from the mask-integrated surface protective tape while leaving the mask material layer.

MODE FOR CARRYING OUT THE INVENTION

Figure 1A:
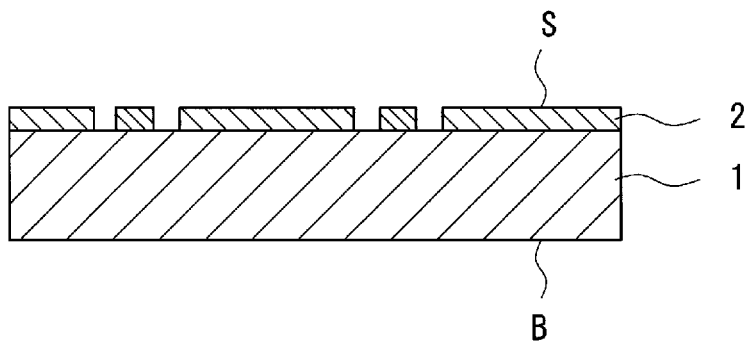
FIGS. 1(a) to 1(c) are a schematic outline cross-sectional view illustrating the mask-integrated surface protective tape of the present invention and schematic cross-sectional views illustrating steps to laminating a mask-integrated surface protective tape onto a semiconductor wafer in the first embodiment of a method of producing a semiconductor chip using the mask-integrated surface protective tape of the present invention (hereinafter, also referred to as the first embodiment using a mask-integrated surface protective tape of the present invention). In the views, fragmentary

In the mask material of the present invention and the mask-integrated surface protective tape using the mask material, the mask material absorbs laser well, and a mask removal can be achieved without a residue in the mask removal step, so that these can be used in a method of dividing and singulating a semiconductor wafer by plasma dicing, thereby to obtain a semiconductor chip. As described below, by using the mask material for plasma dicing and the mask-integrated surface protective tape of the present invention, a mask can be removed without a residue in the mask removal step at the time of plasma dicing and a photolithography process prior to application of the mask becomes unnecessary, whereby production costs of the semiconductor chip and the semiconductor product can be largely suppressed.

<<Mask-Integrated Surface Protective Tape>>

The mask-integrated surface protective tape of the present invention has at least a substrate film and a mask material layer (that is, the tape has at least a substrate film and a mask material layer).

The mask material layer may be provided directly on the substrate film, or may be provided on the substrate film through a temporary-adhesive layer (that is, the substrate film and the mask material layer may be provided facing each other across the temporary-adhesive layer).

Note, in the present invention and the present specification, that a tape in which a temporary-adhesive layer is provided on a substrate film without a mask material layer is referred to simply as a surface protective tape, while a tape having a mask material layer is referred to as a mask-integrated surface protective tape.

In order to protect a patterned surface (front surface) of the semiconductor wafer at the time of backgrinding of the semiconductor wafer, the mask-integrated surface protective tape of the present invention is used to laminate it on the patterned surface.

Accordingly, performances including the same adhesion property as an ordinary semiconductor wafer-processing surface protective tape are required.

In particular, the mask-integrated surface protective tape has a function of protecting a semiconductor device formed on the patterned surface of the semiconductor wafer. Specifically, at the wafer-thinning step (backgrinding step) which is a post-step, the semiconductor wafer is supported by the patterned face of the semiconductor wafer, and the backing-face of the semiconductor wafer is ground. Therefore, the mask-integrated surface protective tape needs to withstand a load in grinding. For this reason, the mask-integrated surface protective tape is different from a mere resist film or the like, and has: the thickness enough to coat the device formed on the patterned face; and the pressing resistance which is low, and has: a high adhesiveness that can adhere tightly to the device, so that the infiltration of dusts, grinding water, and the like, in grinding, is not occurred.

In addition to the above, the mask-integrated surface protective tape of the present invention is suitable for a plasma dicing method, and can eliminate the need for a mask formation by photolithography process in production of the semiconductor chip using a plasma dicing method.

Therefore, the mask-integrated surface protective tape of the present invention is used in the production of the semiconductor chip including at least (A) an opening step of the street portion of the semiconductor wafer by a laser cutting for the surface exposed mask material layer, (B) a plasma-dicing step, and (C) an ashing step of a remaining mask material layer.

In particular, the mask-integrated surface protective tape of the present invention allows production of a semiconductor chip including at least the following steps (a) to (d) in the steps of the production of the semiconductor chip, and is preferably applied to said steps of the production of the semiconductor chip.

[Steps]

(a) A step of, in the state of having laminated the mask-integrated surface protective tape on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame.

(b) a step of, after peeling the substrate firm or integrally peeling both the substrate film and the temporary-adhesive layer from the mask-integrated surface protective tape thereby to expose the mask material layer on top, forming an opening by cutting a portion of the mask material layer corresponding to a street of the semiconductor wafer with a laser.

(c) A plasma-dicing step of segmentalizing the semiconductor wafer at the street with $SF_6$ plasma, and thereby for singulating the semiconductor wafer into semiconductor chips.

(d) A step of removing the mask material layer (preferably, an ashing step of removing the mask material layer by $O_2$ plasma).

Hereinafter, the substrate film, the mask material layer (mask material), and the temporary-adhesive layer are explained in this order.

<Substrate Film>

The substrate film may have a single layer structure, or may be a laminate body in which multiple layers are laminated.

As for the resin or polymer component which constitutes the substrate film, use can be made of resins or polymer components used in a previous semiconductor wafer-processing surface protective tape.

Examples thereof include polyolefin resins, polyester resins, (meth)acrylic resins and furthermore polyphenylene sulfide, polyether imide, polyimide, polycarbonate, polyurethane, and rubber. They may be a single substance or a mixture of two or more kinds.

Examples of the polyolefin resins include a polyolefin resin selected from polyethylene, polypropylene, and ethylene-propylene copolymer, each of which is preferable in the present invention.

Meanwhile, polyethylene and polypropylene other than homopolymer polyethylene and homopolymer polypropylene ordinarily contain $\alpha$-olefin as a copolymer component in order to adjust its density. In particular, with respect to polyethylene, the content of $\alpha$-olefin in the polyethylene is generally 5% by mole or less.

The polyethylene is classified into, depending on its density (specific gravity) and the like, a high density polyethylene (HDPE), a low density polyethylene (LDPE), a very low density polyethylene (VLDPE), a linear low density polyethylene (LLDPE) and an ultra-high molecular weight polyethylene (UHMW-PE).

Examples of the polypropylene include homopolypropylene, random polypropylene, block polypropylene, and the like.

Examples of the polyethylene resins other than the above-described ones include polystyrene or its copolymers, polybutene-1, poly-4-methylpentene-1, ethylene-vinyl acetate copolymer, ethylene-(meth)acrylic acid copolymer or (meth)acrylic acid copolymer, homopolymer or copolymer of $\alpha$-olefin such as ionomer and the like, a mixture of these polymers, and the like.

Examples of the polyester resin include polyethylene terephthalate (PET), polytrimethylene terephthalate (PTT), polybutylene terephthalate (PBT), polyethylene naphthalate (PNT), and polybutylene naphthalate (PBN).

In the present invention, the substrate film preferably has at least a polyolefin resin layer, and the polyolefin resin is more preferably polyolefin and is still more preferably a low-density polyolefin.

Further, in a case where the substrate film is a laminate body in which plural layers are laminated, a laminate body composed of a low density polyethylene layer and an ethylene-vinyl acetate copolymer layer, a laminate body composed of a polypropylene layer and a polyethylene terephthalate layer, or a laminate body composed of a polyolefin resin layer, a polyethylene terephthalate layer and a polyethylene naphthalate layer is one of preferable materials.

The foregoing substrate film can be produced using a general extrusion method. In the case where the substrate film is obtained by laminating various resins, these are produced by a co-extrusion method, a lamination method or the like. At this time, as conventionally practiced in the ordinary production method of the laminate film, an adhesion layer may be provided between resins.

In the present invention, the thickness of the substrate film is preferably from 20 to 200 μm from the viewpoints of strength-elongation characteristics and radiolucency.

<Mask Material Layer and Mask Material>

The mask material layer is a layer that protects a front surface of the semiconductor wafer (patterned surface in particular) from etching (dicing) by irradiation of plasma such as $SF_6$ in the plasma dicing step and moreover is a layer that allows a high-precision division of the semiconductor wafer by selectively etching (dicing) only a street portion of the semiconductor wafer which has been removed in the opening step.

In the present invention, since the mask material layer is used in a way such that it is laminated on a patterned surface of the semiconductor wafer, the mask material layer has performances including a temporary-adhesion property as is the case with a temporary-adhesive layer in the ordinary semiconductor wafer-processing surface protective tape.

The mask material of the present invention is used in the plasma step and is a mask material for plasma dicing, whose surface roughness Rz at the surface side that does not touch with an adherend is from 0.1 μm to 1.5 μm.

The mask material layer is composed of the mask material of the present invention.

In the present specification, the surface roughness Rz is a ten point average roughness defined in JIS B 0601 (1994), and can be determined according to this.

By controlling the surface roughness Rz in a range of 0.1 μm to 1.5 μm, two effects of mask material removability by laser and prevention of the mask material-peeling at the time of peeling the separator (the separator means a surface protective tape or a substrate film in the mask-integrated surface protective tape of the present invention) are obtained.

When the surface roughness Rz is 0.1 μm or more, it is possible to suppress a problem that when the separator is peeled, the mask material is peeled from the surface of the temporary-adhesive (layer) or the substrate film. In reverse, when the surface roughness Rz is 1.5 μm or less, it is possible to suppress problems that removal efficiency is reduced or the removal becomes impossible at the time of removal of the mask material by laser.

The surface roughness Rz of the above-described mask material can be adjusted to a range of 0.1 μm to 1.5 μm by adjusting the surface roughness Rz of the substrate film at the side of laminating a mask material layer thereon to a range of 0.1 μm to 1.5 μm in a case where a temporary-adhesive layer is absent, or by adjusting the surface roughness Rz of the temporary-adhesive layer at the side of laminating a mask material layer thereon to a range of 0.1 μm to 1.5 μm in a case where the temporary-adhesive layer is present. Further, because the surface roughness of the temporary-adhesive layer is contributable to a surface roughness of the separator at the time of transfer coating the temporary-adhesive layer onto a substrate film, the surface roughness of the temporary-adhesive layer can be also adjusted by adjusting the surface roughness of the separator.

More specifically, in a case where the temporary-adhesive layer is absent, for example, the surface roughness can be adjusted by controlling the roughness of a cooling roll that is used in formation of the substrate film, or in a case of using a commercially available substrate film, by controlling the roughness of rolls that depress the substrate film.

On the other hand, in a case where the temporary-adhesive layer is present, for example, the surface roughness can be adjusted by controlling the roughness of a roll that depresses from the top of the release liner in the structure in which the temporary-adhesive layer is provided on a substrate film and a release liner is provided on the temporary-adhesive layer.

In the present invention, of the above-described step (b), in a step of cutting by laser, of the exposed mask material layer on top, a portion of the mask material layer corresponding to the street of the semiconductor wafer, thereby to form an opening of the street of the semiconductor wafer, a laser light is irradiated.

The laser light to be irradiated is not particularly limited, as exemplified by $CO_2$ laser (gas laser of carbon dioxide), YAG laser (solid laser using yttrium, aluminum and garnet), a semiconductor laser, and the like.

Therefore, in the present invention, the parallel ray absorption rate at least in the wavelength region of 355 nm (YAG laser) and 10800 nm ($CO_2$ laser) of the mask material layer is preferably 50% or more, more preferably 65% or more, and furthermore preferably 75% or more. In the present invention, the parallel ray absorption rate in the wavelength region of 355 nm to 10800 nm of the mask material layer is preferably 50% or more.

Herein, the parallel ray absorption rate includes a thickness of the mask material (layer) to be used, but is not a value converted to a unit thickness.

When the parallel ray absorption rate is 50% or more, the mask material layer has an adequate laser light absorption. This allows overcoming of the following problems resulting from a deficiency of the laser light absorption. That is, one of the problems in the opening step of the street portion of the semiconductor wafer is that a laser irradiation needs several times for opening, so that a processing is extended for a long time of period, and another problem is that the mask material layer melts and becomes a residue thereof due to an energy input of the excessive laser light and as a result, the residue remains on the surface of the semiconductor wafer and degrades a processing quality.

The parallel ray absorption rate is calculated according to the following formula by fixing a mask material layer to a jig and measuring a transmittance at the wavelengths of 355 nm and 10800 nm using an ultraviolet and visible spectrophotometer [for example, ultraviolet and visible spectrophotometer UV-1800 (trade name, manufactured by Shimadzu Corporation)].

As described above, the parallel ray absorption rate of the mask material layer is a measured value of a measuring mask material sample having the same thickness as the mask material layer of the mask-integrated surface protective tape.

Parallel ray absorption rate [%]=100−Parallel ray transmittance rate [%]

[[Resin]]

As for the resin that constitutes the mask material layer, any resins may be used. However, a resin that is used as a temporary-adhesive that constitutes a temporary adhesive layer in an ordinary semiconductor wafer processing-surface protective tape is preferred.

As for the above-described resin that is used as a temporary-adhesive, a resin composed of (meth)acrylic copolymer is preferred.

Note, in the present invention and the present specification, that the term "(meth)acryl" collectively means "acryl" and "methacryl" and may be either one of "acryl" and "methacryl", or may be a mixture thereof. For example, (meth)acrylic acid ester means acrylic acid ester and/or methacrylic acid ester.

Therefore, in the present invention, it is preferable for the mask material layer to contain (meth)acrylic copolymer. Meanwhile, the expression "to contain (meth)acrylic copolymer" means to embrace an embodiment in which the (meth)acrylic copolymer is present in the state of being reacted with a curing agent.

The (meth)acrylic copolymer may be a copolymer of two or more kinds of different (meth)acrylic esters, and therefore may be a copolymer of (meth)acrylic ester and a monomer having an ethylenically unsaturated group, which includes (meth)acrylic acid and (meth)acrylic acid amide.

Herein, examples of the monomer having an ethylenically unsaturated group other than the above monomers include (meth)acrylic nitrile, styrene, ethylene, propylene, butylene, butadiene, vinyl alcohol, vinyl acetate, vinyl chloride, maleic acid (esters and acid anhydride are also included), and the like.

In the present invention, as the above-described polymer, a copolymer of two or more kinds of monomers selected from (meth)acrylic acid esters and (meth)acrylic acids is preferred. Further, as a polymer that is contained in a resin that constitutes the mask material layer, it may be one kind of copolymer, or a mixture of plural kinds of copolymers.

Although the (meth)acrylic acid ester may be a (meth)acrylic acid alkyl ester or a (meth)acrylic acid aryl ester, and the (meth)acrylic acid alkyl ester is preferable.

Further, the number of carbon atoms in the alcohol portion (ester forming-alcohol) of the (meth)acrylic acid ester is preferably from 1 to 20, more preferably from 1 to 15, and further preferably from 1 to 12.

Meanwhile, the alcohol portion of the (meth)acrylic acid ester may have a substituent (for example, a hydroxyl group).

Examples of the (meth)acrylic acid ester include methyl (meth)acrylate, ethyl (meth)acrylate, n-propyl (meth)acrylate, iso-propyl (meth)acrylate, n-butyl (meth)acrylate, t-butyl (meth)acrylate, n-hexyl (meth)acrylate, cyclohexyl (meth)acrylate, n-octyl (meth)acrylate, 2-ethylhexyl (meth)acrylate, decyl (meth)acrylate, dodecyl (meth)acrylate, and 2-hydroxyethyl (meth)acrylate.

A proportion of the (meth)acrylic acid ester component of the total monomer component of the (meth)acrylic copolymer is preferably 70% or more, more preferably 80% or more, and further preferably 90% or more. Further, in a case where the proportion of the (meth)acrylic acid ester component of the total monomer component of the (meth)acrylic copolymer is not 100% by mole, it is preferable that the remaining monomer component is a monomer component ((meth)acrylic acid and the like) existing in the form of (meth)acryloyl group polymerized as a polymerizable group.

Further, the proportion of the (meth)acrylic acid ester component having a functional group (for example, hydroxyl group) reacting with a curing agent described below, of the total monomer component of the (meth)acrylic copolymer is preferably 1% by mole or more, more preferably 2% by mole or more, further preferably 5% by mole or more, and particularly preferably 10% by mole or more. Note that, the proportion of the (meth)acrylic acid ester component having a functional group reacting with the above-described curing agent is preferably 35% by mole or less, more preferably 25% by mole or less.

The mass-average molecular weight of these copolymers is normally about 300,000 to 1,000,000.

Herein, the mass-average molecular weight can be measured as a polystyrene conversion molecular weight by Gel Permeation Chromatography (GPC).

The content of the resin (preferably (meth)acrylic copolymer) in the mask material layer (the content converted to the state before reacting with a curing agent) is preferably 80% by mass or more, more preferably 90% by mass or more, and further preferably from 95 to 99.9% by mass.

[[Curing Agent]]

The (meth)acrylic copolymer in the mask material layer is preferably cured and it is preferable for the mask material layer-forming composition to contain a curing agent in addition to the (meth)acrylic copolymer.

The curing agent is used to adjust an adhesive force and a cohesion force by reacting it with a functional group which the (meth)acrylic copolymer has.

Examples of the curing agent include: an epoxy compound having two or more epoxy groups in the molecule (hereinafter, also referred to as "epoxy-series curing agent"), such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, N,N,N',N'-tetraglycidyl-m-xylenediamine, ethylene glycol diglycidyl ether, or terephthalic acid diglycidyl ester acrylate; an isocyanate compound having two or more isocyanate groups in the molecule (hereinafter, also referred to as "isocyanate-series curing agent"), such as 2,4-tolylenediisocyanate, 2,6-tolylenediisocyanate, 1,3-xylylenediisocyanate, 1,4-xylylenediisocyanate, diphenylmethane-4,4'-isocyanate, hexamethylene diisocyanate, isophorone diisocyanate, or an adduct type of these; an aziridine compound having two or more aziridinyl groups in the molecule (aziridine-series curing agent), such as tetramethylol-tri-β-aziridinyl propionate, trimethylol-tri-β-aziridinyl propionate, trimethylolpropane-tri-β-aziridinyl propionate, trimethylolpropane-tri-β-(2-methylaziridine)propionate, tris-2,4,6-(1-aziridinyl)-1,3,5-triazine, tris[1-(2-methyl)-aziridinyl]phosphine oxide, or hexa[1-(2-methyl)-aziridinyl]triphosphatriazine; and the like. An addition amount of the curing agent may be adjusted depending on a desired adhesion force, and is suitably from 0.1 to 5.0 mass parts with respect to 100 mass parts of the (meth)acrylic copolymer. In the mask material layer of the mask-integrated surface protective tape of the present invention, the curing agent is in a state of having reacted with the (meth)acrylic copolymer.

<Radiation-Curable Mask Material Layer>

As the mask material layer, any one of the radiation-curable type mask material layer whose mask material is cured by irradiation of the radiation, or the non-radiation-curable type mask material layer may be workable. In the present invention, in any case where a layer having a contact with the mask material layer is a substrate film or a temporary-adhesive layer provided on the substrate film, as described below, peeling of the substrate film or the surface protective tape can be easily performed while leaving only the mask material layer on the patterned surface of the semiconductor wafer and therefore a radiation-curable type mask material layer is preferable.

Herein, the non-radiation-curable type is also called as a pressure-sensitive type as is the case with a temporary-adhesive. This type of the mask material layer is composed of the above-described resin and a resin cured by the curing agent and means not to contain a component having an ethylenically unsaturated group that cures by irradiation of radiation.

In a case of a radiation-curable type mask material layer, in the above-described step (b), it becomes easy to leave only the mask material layer on the semiconductor wafer surface.

Specifically, an interlayer-peeling property between the mask material layer and the layer having contact with this mask material layer (a substrate film, or in a case of the surface protective tape, a temporary-adhesive layer of the surface protective tape) is improved by irradiating a radiation from the side of the substrate film of the mask-integrated surface protective tape thereby to cure, so that the peeling of the substrate film or the surface protective tape from the mask-integrated surface protective tape becomes easy.

This is thought to be caused in a manner such that a mask material layer is 3-dimensionally reticulated by exposure to radiation, so that a temporary-adhesion power is lowered and thereby a strong adhesion to a layer having contact with the mask material layer, for example, to a temporary-adhesive layer, is released and as a result, it becomes possible to peel easily the layer having contact with the mask material layer, for example, the temporary-adhesive layer, from the mask-integrated surface protective tape.

However, it is preferable that the adhesion power between the mask material layer and the substrate film or the temporary-adhesive layer which contact with the mask material layer becomes lower by exposure to radiation than the adhesion power between the mask material layer and a patterned surface of the semiconductor wafer.

In the present invention and the present specification, the term "radiation" is a concept including both a light beam such as ultraviolet, and an ionizing radiation such as an electron beam. The radiation for use of the present invention is preferably ultraviolet.

In order to make the mask material layer radiation-curable, the mask material layer should be made to have a property of being cured and 3-dimentionally reticulated by radiation as is the case with a radiation-curable type temporary-adhesive of the ordinarily semiconductor wafer-processing surface protective tape.

In order to make the mask material layer radiation-curable, broadly (1) the mask material layer should contain a resin (polymer) having an ethylenically unsaturated group (radiation-polymerizable carbon-carbon double bond which is also called as an ethylenically double bond) in the side chain, or (2) the mask material layer should contain a low molecular weight compound having at least two ethylenically unsaturated double bonds in the molecule (this compound includes an oligomer and hereinafter, is also called as a radiation-polymerizable low molecular weight compound) together with a resin (polymer) used in the above-described pressure-sensitive type.

In the present invention, although any of the above-described methods (1) and (2) is effective, the method (1) is preferable.

As an ethylenically unsaturated group includes: a vinyl group, an allyl group, a styryl group, a (meth)acryloyloxy group, a (meth)acryloylamino group, and the like.

[(1) Resin Having Ethylenically Unsaturated Group in Side Chain]

The resin (polymer) having an ethylenically unsaturated group in the side chain can be obtained by reacting a copolymer having a reactive functional group ($\alpha$) such as a hydroxyl group and the like at the side chain and a compound having a functional group ($\beta$), such as an isocyanate group and the like, that reacts with the reactive functional group ($\alpha$) and further having an ethylenically unsaturated group. Representative examples of the compound having the reactive functional group ($\beta$) and the ethylenically unsaturated group include 2-(meth)acryloyloxyethyl isocyanate.

Examples of the above-described functional groups ($\alpha$) and ($\beta$) include a carboxyl group, a hydroxyl group, an amino group, a mercapto group, a cyclic acid anhydride group, an epoxy group, an isocyanate group (—N═C═O) and the like. Herein, the cyclic acid anhydride group is a group having a cyclic acid anhydride structure.

As a combination of the above-described functional groups ($\alpha$) and ($\beta$), for example, in a case of a nucleophilic substitution reaction, one is a nucleophile and another is an electrophile.

The resin having an ethylenically unsaturated group in the side chain is preferably a resin composed of a (meth)acrylic copolymer.

As the (meth)acrylic copolymer, at least in a unit structure obtained from a (meth)acrylic acid ester, a polymer having a unit structure having an ethylenically unsaturated group in the alcohol portion of the ester is preferable.

Further, it is preferable for the above-described (meth)acrylic copolymer to have, in addition to the unit structure having an ethylenically unsaturated group in the above-described alcohol portion, a recurring unit obtained from a (meth)acrylic acid ester that has no ethylenically unsaturated group in the alcohol portion thereof, (meth)acrylic acid, and a monomer having another ethylenically unsaturated group. Of these polymers, it is preferable to have a recurring unit obtained from a (meth)acrylic acid ester and/or (meth)acrylic acid. In particular, as the recurring unit obtained from a (meth)acrylic acid ester that has no ethylenically unsaturated group in the alcohol portion thereof, it is preferable to have a recurring unit obtained from a (meth)acrylic acid ester in which the number of carbon atoms in the alcohol portion thereof is from 8 to 12.

Of the monomer components that constitute the (meth)acrylic copolymer having an ethylenically unsaturated group in the side chain, the ratio of the alkyl (meth)acrylate component having the number of carbon atoms of 8 to 12 is preferably from 45 to 85% by mole, and more preferably from 50 to 80% by mole.

As the resin having an ethylenically unsaturated group in the side chain, those described in paragraphs [0020] to [0036] of Japanese Patent Publication No. 6034522 are preferable. In the present specification, the contents described in said paragraphs [0020] to [0036] are preferably incorporated therein by reference.

[(2) Radiation-Polymerizable Low Molecular Weight Compound]

As for the radiation polymerizable low molecular weight compound described above, use may be widely applicable of: trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, (meth)acrylate-based compounds such as oligo-ester acrylates, and the like.

Further, in addition to the acrylate-based compounds, use can be also made of a urethane acrylate-based oligomer. The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate and polyethylene glycol containing (meth)acrylate groups such as polyethylene glycol acrylate and polyethylene glycol methacrylate) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4-diisocyanate, and the like).

As a blending ratio of the (meth)acrylic copolymer and the radiation-polymerizable low molecular weight compound which is a polymer used in a pressure-sensitive type, the radiation-polymerizable low molecular weight compound is desirably blended in the range of 50 to 200 mass parts and preferably 50 to 150 mass parts with respect to 100 mass parts of the (meth)acrylic copolymer. When the mixing ratio is in this range, the adhesiveness after irradiation with radiation can be deteriorated.

[Photoradical Polymerization Initiator]

In order to subject the mask material layer to a polymerization and curing by radiation, the use of a photoradical polymerization initiator allows an effective progress of polymerization reaction and therefore is preferable.

Examples of the photoradical polymerization initiator include an alkyl phenone type polymerization initiator, a diaryl ketone type polymerization initiator, a diacyl type polymerization initiator, an acyl phosphine oxide type polymerization initiator, an oxime ester type polymerization initiator, a halogenated alkyl-substituted-1,3,5-triazine type polymerization initiator, and 2,4,5-triaryl imidazole dimer (lophine dimer).

In the present invention, an alkyl- or cycloalkyl-phenone having a hydroxyl group at α-position is preferable.

As the photoradical polymerization initiator, for example, isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylphenyl propane, and the like can be used. By adding at least one of these compounds to the mask material layer, a polymerization reaction can be efficiently accelerated.

[Curing Agent]

Even in the resin that forms a radiation-curable type mask material layer, it is preferable for this resin (polymer) to have been cured by a curing agent. In particular, in a case where this resin is a resin having an ethylenically unsaturated group in the side chain, it is preferable to obtain a cured resin having an ethylenically unsaturated group in the side chain by curing, with the curing agent, a mask material layer formed by using a mask material layer-forming composition containing at least a resin before curing and the curing agent.

As this curing agent, those exemplified in the pressure-sensitive type are preferable. The content of the curing agent in the mask material layer-forming composition is appropriately from 0.1 to 5.0 parts by mass with respect to 100 parts by mass of the resin before curing, such as (meth) acrylic copolymer and the like.

That is, in the mask material layer of the mask-integrated surface protective tape of the present invention, a curing agent is in a state of having reacted with the resin before curing, such as (meth)acrylic copolymer and the like.

[Ultraviolet-Absorbing Constituent]

In the present invention, the parallel ray absorption rate in the wavelength of 355 nm to 10800 nm of the mask material layer is preferably 50% or more.

In order to adjust the parallel ray absorption rate in the wavelength of 355 nm to 10800 nm of the mask material layer to 50% or more, it is preferable for the mask material layer to contain an ultraviolet-absorbing constituent.

As the ultraviolet-absorbing constituent, an ultraviolet absorber or an ultraviolet-absorbing polymer is preferable.

(Ultraviolet Absorber)

Since the ultraviolet absorber is excellent in compatibility to the resin, has a high transparency, and has high absorption performance to a laser in the ultraviolet region in a small amount thereof, it can be preferably used in the present invention.

It is preferable for the mask material layer to contain at least one kind of ultraviolet absorber having a triazine skeleton, a benzophenone skeleton, a benzotriazole skeleton or a benzoate skeleton.

As the ultraviolet absorber, examples of the compound having a triazine skeleton include 2,4-bis[2-hydroxy-4-butoxyphenyl]-6-(2,4-dibutoxyphenyl)-1,3,5-triazine, 2,4-bis(2,4-dimethylphenyl)-6-(2-hydroxy-4-n-octyloxyphenyl)-1,3,5-triazine, 2-(2,4-dihydroxyphenyl)-4,6-bis(2,4-dimethylphenyl)-1,3,5-triazine, 2-(2,4-dihydroxyphenyl)-4,6-diphenyl-1,3,5-triazine, and 2-(2-hydroxy-4-methoxyphenyl)-4,6-diphenyl-1,3,5-triazine.

Examples of the compound having a benzophenone skeleton include 2,4-dihyroxybenzophenone, 2,2'-dihydroxy-4,4'-dimethoxybenzophenone, 2-hydroxy-4-methoxybenzophenone, 2-hydroxy-4-n-octyloxybenzophenone, and 2,2',4,4'-tetrahydroxybenzophenone.

Examples of the compound having a benzotriazole skeleton include 2-(2-hydroxy-5-t-butylphenyl)-2H-benzotriazole, 2-(2H-benzotriazole-2-yl)-4,6-bis(1-methyl-1-phenylethyl)phenol, and 2-(2H-benzotriazole-2-yl)-6-(1-methyl-1-phenylethyl)-4-(1,1,3,3-tetramethylbutyl)phenol.

Examples of the compound having a benzoate skeleton include 2,4-di-t-butylphenyl-3,5-di-t-butyl-4-hydroxybenzoate, and 2,4-di-t-butylphenyl-4'-hydroxy-3',5'-di-t-butylbenzoate.

As the ultraviolet absorber, a commercially available product may be used. Examples thereof include ADE STAB LA series (LA-24, LA-29, LA-31, LA-32, LA-36, LA-F70, 1413) manufactured by ADEKA Corporation, TINUVIN P, TINUBIN 234, TINUVIN 326, TINUVIN 329, TINUVIN 213, TINUVIN 571, TINUVIN 1577ED, CHIMASSORB 81, TINUVIN 120 and the like, each of which are manufactured by BASF Corporation.

One kind or a combination of two or more kinds of the ultraviolet absorber may be used.

The addition amount of the ultraviolet absorber may be adjusted according to a desired laser absorption performance. The content of the ultraviolet absorber in the mask material layer is preferably from 0.1 to 5.0 parts by mass and more preferably from 0.5 to 1.5 parts by mass, with respect to 100 parts by mass of the resin (preferably (meth)acrylic copolymer).

In a case where the resin that forms a mask material layer is a resin cured by a curing agent, the above-described 100 parts by mass of the resin means a resin before curing by a curing agent.

(Ultraviolet-Absorbing Polymer)

In order for the mask material layer to have high laser absorptivity, it is preferable for the mask material layer to contain an ultraviolet-absorbing polymer. In the present specification, the term "ultraviolet-absorbing polymer" means a polymer whose ultraviolet-absorbing performance has been given to the polymer itself by introducing thereto a recurring unit obtained by a polymerizable monomer (copolymerizable monomer) having an ultraviolet-absorbing group as one of recurring units (segments) that constitute the polymer molecule. The above-described ultraviolet-absorbing polymer has no problem such as elution or bleed-out of the ultraviolet-absorbing constituent, compared to a composition in which an ultraviolet absorber has been kneaded and blended into a general-purpose polymer.

As the ultraviolet-absorbing polymer, those having an ultraviolet-absorbing skeleton in the side chain are preferred.

Examples of the ultraviolet-absorbing skeleton include those exemplified in the ultraviolet absorber. In the present invention, a benzotriazole skeleton, a benzophenone skeleton, or a triazine skeleton is preferable.

Examples of the ultraviolet-absorbing polymer having an ultraviolet-absorbing skeleton in the side chain include polymers composed of a monomer having these skeletons as a copolymerization constituent. Preferable examples of the monomer having these skeletons include a compound having at least one of the above-described ultraviolet-absorbing skeletons in the alcohol portion of the (meth)acrylic acid ester.

Therefore, in the present invention, the ultraviolet-absorbing polymer is preferably a (meth)acrylic polymer having an ultraviolet-absorbing skeleton, and more preferably a (meth)acrylic polymer having an ultraviolet-absorbing skeleton selected from at least any one of a benzotriazole skeleton, a benzophenone skeleton and a triazine skeleton in the side chain thereof.

The ultraviolet-absorbing polymer is obtained by polymerizing (preferably polymerizing as a copolymerizing constituent) a (meth)acrylic acid ester compound (monomer) having an ultraviolet-absorbing skeleton in an alcohol portion of the (meth)acrylic acid ester compound. In polymerizing an ultraviolet-absorbing monomer, one kind or a combination of two or more kinds of the ultraviolet-absorbing monomer may be used.

Preferable compounds as an ultraviolet-absorbing monomer are represented by any of the following Formulae (I) to (VII).

{Formula 1}

Formula (I)

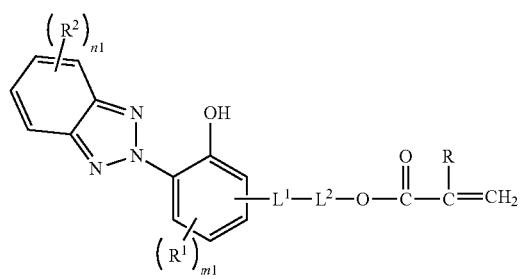

Formula (II)

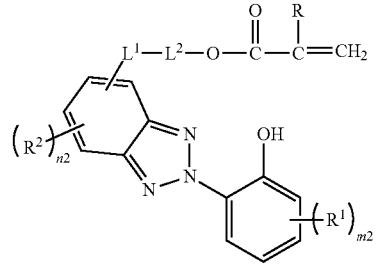

Formula (III)

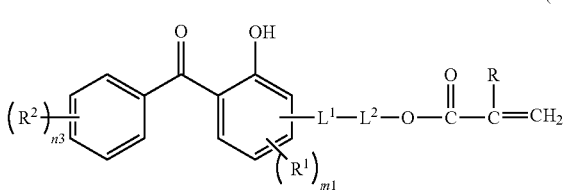

Formula (IV)

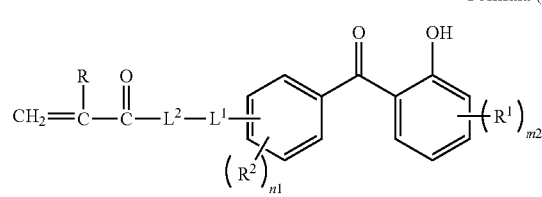

Formula (V)

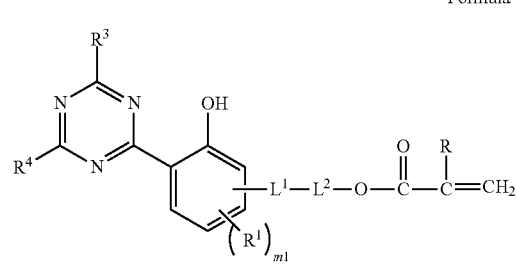

Formula (VI)

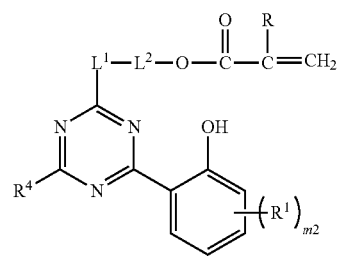

Formula VII)

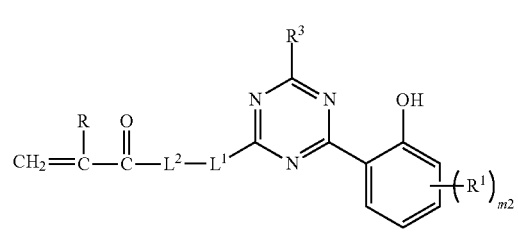

In Formulas, R designates a hydrogen atom or a methyl group, and $R^1$ to $R^4$ each independently designate a substituent. m1 is an integer of 0 to 3, m2 is an integer of 0 to 4, n1 is an integer of 0 to 4, n2 is an integer of 0 to 3, and n3 is an integer of 0 to 5. $L^1$ designates a single bond or a divalent linking group, and $L^2$ designates an alkylene group.

Herein, the amino group in the explanation of the following substituents includes —NH$_2$, an alkyl amino group, an aryl amino group, and a heterocyclic amino group.

Examples of the substituent for R$^1$ to R$^4$ include a halogen atom, an alkyl group, a cycloalkyl group, an aryl group, a heterocyclic group, an alkoxy group, an aryloxy group, a heterocyclic oxy group, an alkylthio group, an arylthio group, a heterocyclic thio group, a hydroxyl group, a sulfanyl group (—SH), an amino group, an acyl group, an acylamino group, a sulfonamide group, a carbamoyl group, a sulfinamoyl group, an acyloxy group, an alkoxycarbonyl group, an aryloxycarbonyl group, a sulfonyl group, a carboxy group, a sulfo group, and a nitro group.

R$^3$ and R$^4$ each are preferably an alkyl group, an aryl group, an alkoxy group, an aryloxy group or an amino group.

The divalent linking group for L$^1$ designates —S—, —N(Ra)—, —C(=O)—, an alkylene group, an arylene group, a divalent heterocyclic group, and a combination of these groups. Herein, Ra designates a hydrogen atom or a substituent.

Herein, examples of the combination of these groups include —C(=O)—O—, —O—C(=O)—, —N(Ra)—C(=O)—, —C(=O)—N(Ra)—, -alkylene-O—, —O-alkylene-O—, -alkylene-S—, -alkylene-N(Ra)—, -arylene-S—, and -arylene-N(Ra)—.

The number of carbon atoms of the alkylene group for L$^2$ is preferably 1 to 20, more preferably 2 to 18, and further preferably 2 to 8. Examples thereof include methylene, ethylene, propylene, trimethylene, butylene, hexylen, and octylene.

Meanwhile, preferable compounds of the ultraviolet absorber can be represented by the same formulas as any of the above-described Formulas (I) to (VII) from each of which -L$^1$-L$^2$-O—C(=O)—C(R)=CH$_2$ is eliminated.

Examples of these ultraviolet-absorbing monomers include 2-[3-(2H-1,2,3-benzotriazole-2-yl)-4-hydroxyphenyl]ethyl methacrylate, 2-[2-(2-hydroxy-4-octyloxyphenyl)-2H-1,2,3-benzotriazole-5-yloxy]ethyl methacrylate, 2-[2-hydroxy-5-(methacryloyloxymethyl)phenyl]-2H-benzotriazole, 2-(4,6-dipheny-1,3,5-triazine-2-yl)-5-[2-(acryloyloxy)ethoxy]phenol, 2-(4,6-dipheny-1,3,5-triazine-2-yl)-5-[2-(methacryloyloxy)ethoxy]phenol, and the like.

Other monomer constituents that can be copolymerized with the above-described ultraviolet-absorbing monomers are not particularly limited and may be adequately selected and used.

Examples thereof include (meth)acrylic acid alkyl esters such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, 2-ethylhexyl (meth)acrylate, octyl (meth)acrylate, nonyl (meth)acrylate, lauryl (meth)acrylate, and stearyl (meth)acrylate.

Further, examples thereof include hydroxyl group-containing unsaturated monomers such as hydroxyethyl (meth)acrylate, hydroxypropylethtyl (meth)acrylate, and hydroxybutyl (meth)acrylate.

The proportion of the ultraviolet-absorbing monomer constituent of the total monomer constituents that constitute the ultraviolet-absorbing polymer is preferably 50% by mass or more. Although the upper limit of this proportion is not particularly limited, it is preferably 70% by mass or less.

The mass average molecular weight of the ultraviolet-absorbing polymer is preferably from about 10,000 to about 200,000.

As the ultraviolet-absorbing polymer, a commercially available product may be used. Examples thereof include VANARESIN UVA-5080, VANARESIN UVA-5080 (OHV20), VANARESIN UVA-7075, VANARESIN UVA-7075 (OHV20), VANARESIN UVA-55T, VANARESIN UVA-55MHB, VANARESIN UVA-73T, NEWCOAT UVA-101, NEWCOAT UVA-102, NEWCOAT UVA-103 and NEWCOAT UVA-104 (each trade name, manufactured by Shin Nakamura Chemical Co., Ltd.).

In the present invention, the ultraviolet-absorbing polymer may be used as a base resin without any other base resins. In other words, the ultraviolet-absorbing polymer may be used alone as a resin that constitutes the mask material layer.

Note, in the present invention, that a resin itself having an ethylenycally unsaturated group in the side chain may have an ultraviolet-absorbing skeleton in the side chain.

Herein, when added and used to the base resin, for example, a (meth)acrylic copolymer, the content of the ultraviolet-absorbing polymer may be adjusted according to a desired laser absorption performance and the content thereof is appropriately from 5.0 to 50.0 parts by mass with respect to 100 parts by mass of the base resin, for example, a (meth)acrylic copolymer.

Further, as described above, in a case where the ultraviolet-absorbing polymer is used alone as a resin that constitutes the mask material layer, the content of the ultraviolet-absorbing polymer in the mask material layer is preferably from 90% by mass to 100% by mass.

The thickness of the mask material layer is preferably from 5 to 100 μm and more preferably from 5 to 40 μm from the viewpoint of removal rate in plasma ashing.

<Temporary-Adhesive Layer>

The mask-integrated surface protective tape of the present invention has at least a substrate film and a mask material layer and the mask material layer is provided directly on the substrate film or provided on the substrate film through a temporary-adhesive layer.

In the present invention, the mask material layer is preferably provided on the substrate film through a temporary-adhesive layer. In other words, the mask material layer is preferably arranged above the temporary-adhesive layer of the surface protective tape.

The temporary-adhesive layer takes a role in protection of the patterned surface together with a mask material layer by covering an asperity of the device formed on the patterned surface to enhance adhesion property to the patterned surface. In order to make the mask-integrated surface protective tape withstand a load of the wafer-thinning step, it is preferable that the adhesion property of the temporary-adhesive layer to a mask material layer or a substrate film in the wafer-thinning step is high. On the other hand, after the wafer-thinning step, because the temporary-adhesive layer is integrally peeled with the substrate film from the mask material layer, it is preferable that the adhesion property of the temporary-adhesive layer to the mask material layer is low (high peeling property is preferable).

As for the temporary-adhesive that constitutes the temporary-adhesive layer, temporary-adhesives used in a conventional surface protective tape for semiconductor wafer may be used.

The temporary-adhesive may be a radiation-curable type temporary-adhesive or a pressure-sensitive type temporary-adhesive. In a case where the mask material layer is a radiation-curable type, a pressure-sensitive type temporary-adhesive is preferred, while in a case where the mask material layer is a pressure-sensitive type, a radiation-curable type temporary-adhesive is preferred.

Therefore, in the present invention, because it is preferable for the mask material layer to be a radiation-curable type, a pressure-sensitive type temporary-adhesive is preferred. In other words, it is preferable that the mask-integrated surface protective tape of the present invention has a constitution in which the mask material layer is provided on a substrate film through a temporary-adhesive layer and the temporary-adhesive that constitutes the temporary-adhesive layer is a pressure-sensitive type temporary-adhesive.

Explanation of the mask material layer is preferably and directly applied to the temporary-adhesive layer. Note that, of the description of the mask material layer, both the description that the parallel ray absorption rate in the wavelength region of 355 nm to 10800 nm of the mask material layer is preferably 50% or more and the description about an ultraviolet-absorbing constituent used for this purpose are not applied thereto.

However, in the present invention, an ultraviolet-absorbing constituent may be contained in the temporary-adhesive layer. In this case, the content of the ultraviolet-absorbing constituent in the temporary-adhesive layer is preferably an amount to be less than 50% in terms of parallel ray absorption rate in the wavelength region of 355 nm of the temporary-adhesive layer, and it is more preferable for the temporary-adhesive layer not to contain the ultraviolet-absorbing constituent.

The thickness of the temporary-adhesive layer is preferably from 5 to 100 μm from the viewpoints of more increasing protective ability of the device or the like formed on the patterned surface thereof, and more increasing adhesion to the patterned surface of the semiconductor wafer. Meanwhile, depending on the type of devices, since the asperity of the patterned surface of the semiconductor wafer is roughly from about several micron meters to about 15 μm, the thickness of the temporary-adhesive layer is more preferably from 5 to 30 μm.

Further, depending on the type of devices, the thickness of the temporary-adhesive layer is preferably equal to or more than that of the mask material layer and it is more preferable that the temporary-adhesive layer is thicker than the mask material layer.

Figure 1B:
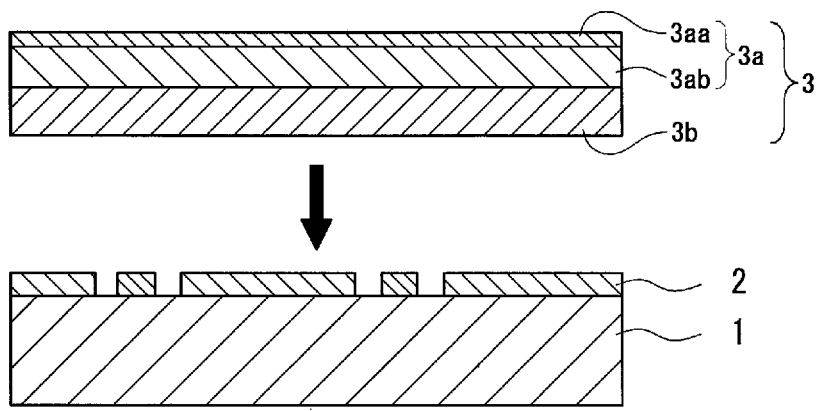
Figure 1C:
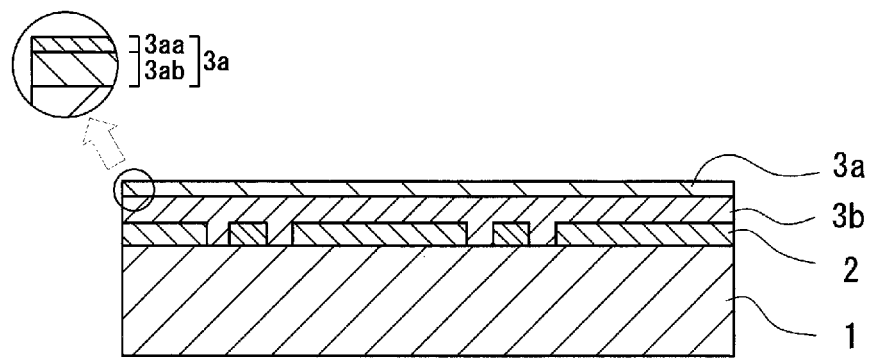

Of the mask-integrated surface protective tape of the present invention, the mask-integrated surface protective tape having a temporary-adhesive layer has a constitution as shown in fragmentary FIGS. 1(b) and 1(c).

In the fragmentary FIGS. 1(b) and 1(c), a mask-integrated surface protective tape 3 has a temporary-adhesive layer 3ab on a substrate film 3aa, and further has a mask material layer 3b on the temporary-adhesive layer 3ab.

Herein, a tape composed of the substrate film 3aa and the temporary-adhesive layer 3ab is a surface protective tape 3a.

Note, in the fragmentary FIGS. 1(b) and 1(c), that in a case where the mask-integrated surface protective tape 3 does not have the temporary-adhesive layer 3ab, the part of the surface protective tape 3a acts as a substrate film 3a.

In the present invention, the mask material layer 3b and the temporary-adhesive layer 3ab may contain constituents other than a resin, a curing agent and a photoradical polymerization initiator, each of which is used in a conventional surface protective tape for processing a semiconductor wafer.

<<Method of Producing Semiconductor Chip>>

In the present invention, a semiconductor chip is preferably produced particularly through the following steps including (a) to (d).

[Steps]

(a) A step of, in the state of having laminated the mask-integrated surface protective tape of the present invention on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame.

(b) A step of, after peeling the substrate firm or integrally peeling both the substrate film and the temporary-adhesive layer from the mask-integrated surface protective tape thereby to expose the mask material layer on top, forming an opening by cutting a portion of the mask material layer corresponding to a street of the semiconductor wafer with a laser.

(c) A plasma-dicing step of segmentalizing the semiconductor wafer at the street with $SF_6$ plasma, and thereby for singulating the semiconductor wafer into semiconductor chip.

(d) A step of removing the mask material layer (preferably, an ashing step of removing the mask material layer by $O_2$ plasma).

However, in order to expose the mask material layer on top in the above-described step (b), in the mask-integrated surface protective tape of the present invention, in a case where the mask material layer is provided directly on the substrate film, the substrate film is peeled, while in a case where the mask material layer is provided on the substrate film through the temporary-adhesive layer, both the substrate film and the temporary adhesive layer are integrally peeled.

In the method of producing a semiconductor chip according to the present invention, the use of the mask-integrated surface protective tape of the present invention allowed the production of the semiconductor chip through steps including the above-described steps (a) to (d).

In the method of producing a semiconductor chip applied by the mask-integrated surface protective tape of the present invention, the following step (e), after the step (d), is preferably included. When the production method includes the following step (e), the following step (f) is preferably included after the step (e).

(e) A step of picking up the semiconductor chip from the wafer-fixing tape.

(f) A step of transiting the picked-up semiconductor chip to a die bonding step.

Preferable embodiments of the method of producing a semiconductor chip using the mask-integrated surface protective tape of the present invention (hereinafter, simply referred to as "production method to which the present invention is applied") are described below with reference to the drawings. However, the present invention is not limited to the following embodiments, except for the requirements defined by the present invention. Further, the form shown in each drawing is a schematic view for facilitating the understanding of the present invention. Therefore, regarding the size, the thickness, the relative magnitude relation and the like of each component, the large one or the small one is sometimes changed for the purpose of illustration, and the form does not show a real relation as it is. Further, the present invention is not limited to outer forms and shapes shown in these figures, except for the requirements defined by the present invention.

Preferable embodiments of the production method applied by the present invention may be classified into first and second embodiments, as described below.

Note that, as the apparatus, the materials other than the mask-integrated surface protective tape and the like used in the following embodiments, an ordinary apparatus, materials and the like which have been conventionally used in the processing of the semiconductor wafer may be used, unless otherwise indicated, and the conditions of use for them can be appropriately set and optimized in accordance with the intended use within a range of an ordinary method for using. Further, omitted are duplicated descriptions about the materials, structures, methods, effects, and the like, which are common to each embodiment.

Figure 5A:
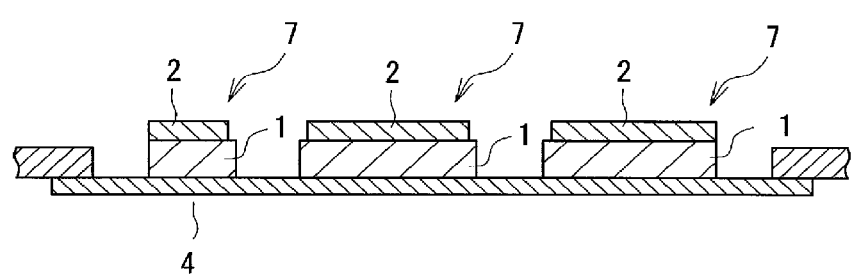
FIGS. 5(a) and 5(b) are schematic cross-sectional views illustrating steps to picking up a chip in the first embodiment using the mask-integrated surface protective tape of the present invention. In the views, fragmentary
Figure 5B:
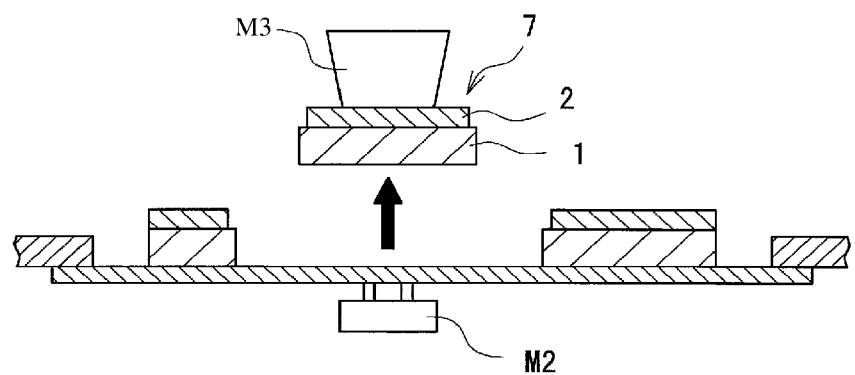

First Embodiment [FIG. 1] to [FIG. 5]

The first embodiment of a production method to which the present invention is applied is described with reference to FIG. 1 to FIG. 5.

Note that since these figures are schematic views showing a layer structure as described above, these do not reflect realistically the thickness of each of the substrate film, the temporary adhesive layer, and the mask material layer. Explanation of the already-described mask-integrated surface protective tape is applied to the substrate film and the thickness of each layer.

A semiconductor wafer 1 has a patterned face 2 on the surface S of which a circuit or the like of the semiconductor device is formed (see fragmentary FIG. 1(a)). On this patterned surface 2, a mask-integrated surface protective tape 3 in which a mask material layer 3b has been further provided on a temporary-adhesive layer 3ab of a surface protective tape 3a in which the temporary-adhesive layer 3ab has been provided on a substrate film 3aa, is laminated (see fragmentary FIG. 1(b)), whereby a semiconductor wafer 1 whose patterned surface 2 is covered with the mask-integrated surface protective tape 3 is obtained (see fragmentary FIG. 1(c)).

Herein, the fragmentary FIGS. 1(b) and 1(c) show the mask-integrated surface protective tape 3 having the mask material layer on the substrate film through the temporary-adhesive layer. In this case, the surface protective tape 3a is composed of the substrate film 3aa and the temporary-adhesive layer 3ab.

A mask-integrated surface protective tape 3 having the mask material layer directly on the substrate film is also included in the mask-integrated surface protective tape of the present invention. In this tape, since the mask-integrated surface protective tape does not have a temporary-adhesive layer directly on the substrate film, 3a in the fragmentary FIGS. 1(b) and 1(c) indicates a substrate film. Therefore, in the subsequent explanation, with respect to the mask-integrated surface protective tape 3 having the mask material layer directly on the substrate film, the expressions "surface protective tape 3a" and "surface protective tape (a mask-integrated surface protective tape is excluded)" should be read "substrate film 3a" and "surface protective tape", respectively.

Figure 2A:
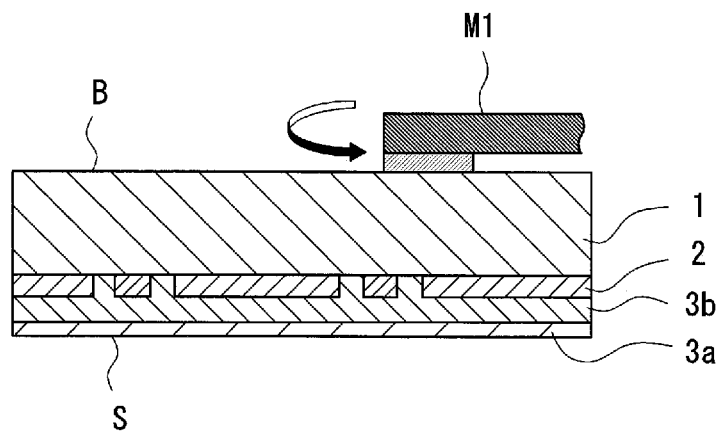
FIGS. 2(a) to 2(c) are schematic cross-sectional views illustrating steps to thinning and fixing of the semiconductor wafer in the first embodiment using the mask-integrated surface protective tape of the present invention. In the views, fragmentary
Figure 2B:
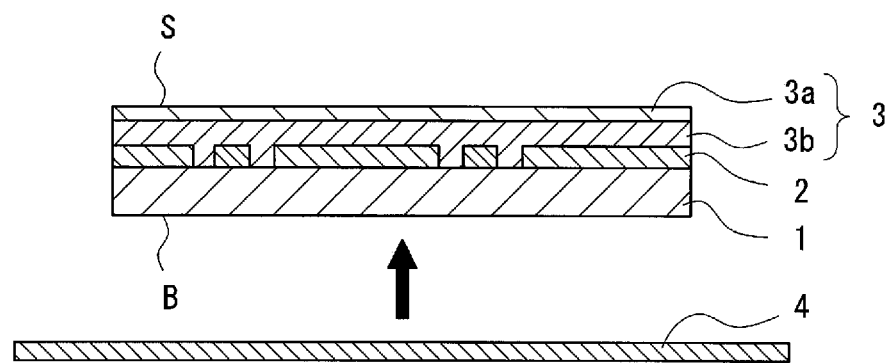

Then, the backing-face B of the semiconductor wafer 1 is ground by a wafer-grinding apparatus M1, to thin a thickness of the semiconductor wafer 1 (see fragmentary FIG. 2(a)). On the ground backing-face B, a wafer-fixing tape 4 is laminated (see fragmentary FIG. 2(b)), to support and fix the wafer to a ring flame F (see fragmentary FIG. 2(c)).

Figure 3A:
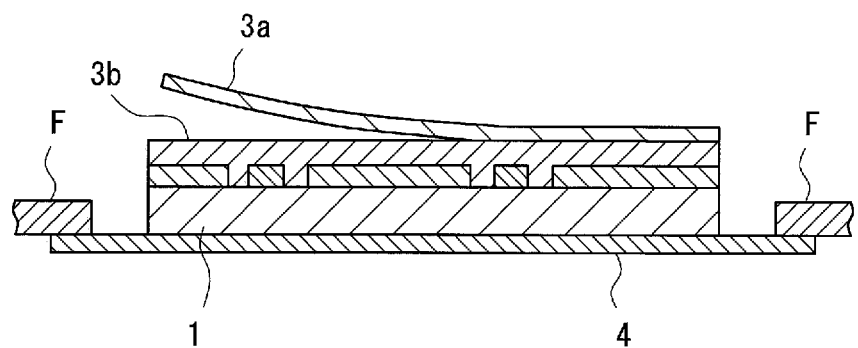
FIGS. 3(a) to 3(c) are schematic cross-sectional views illustrating steps to the mask formation in the first embodiment using the mask-integrated surface protective tape of the present invention. In the views, fragmentary
Figure 3B:
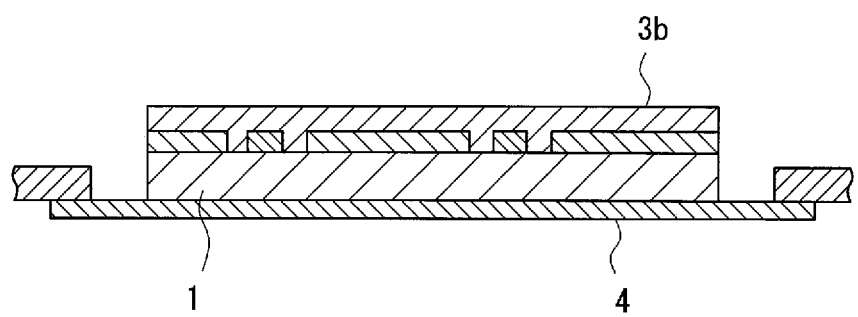
Figure 3C:
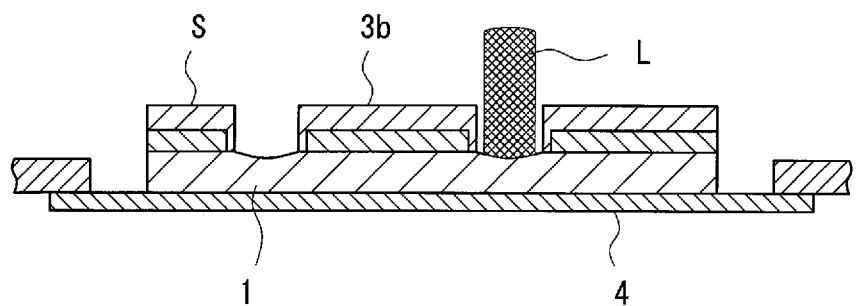

The surface protective tape 3a of the mask-integrated surface protective tape 3 is peeled off from the semiconductor wafer 1, while leaving the mask material layer 3b on the semiconductor wafer 1 (see fragmentary FIG. 3(a)), so that the mask material layer 3b is exposed (uncovered) (see fragmentary FIG. 3(b)). Further, laser L is irradiated from the surface S side toward a plurality of streets (not shown) appropriately formed in a grid pattern or the like onto the patterned face 2, thereby to remove a portion corresponding to the street of the mask material layer 3b, so that the streets of the semiconductor wafer are opened (see fragmentary FIG. 3(c)).

For the laser irradiation with which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged. Laser can be irradiated, which is provided with an output controlled suitably to remove the mask material layer 3b.

Meanwhile, the laser is not particularly limited to $CO_2$ and YAG lasers. However, in particular, a laser having a UV wavelength region of 355 nm which is the third harmonic of YAG laser and 10800 nm of $CO_2$ laser may be preferably used. Specifically, since these lasers have very high absorption rate for various materials and does not put a thermal stress, these lasers can be used for microfabrication requiring high quality. Further, since a beam diameter thereof can be narrowed when compared to a long wave laser, more microscopic processing can be performed, so that these lasers can be preferably applied to the present invention.

Figure 4A:
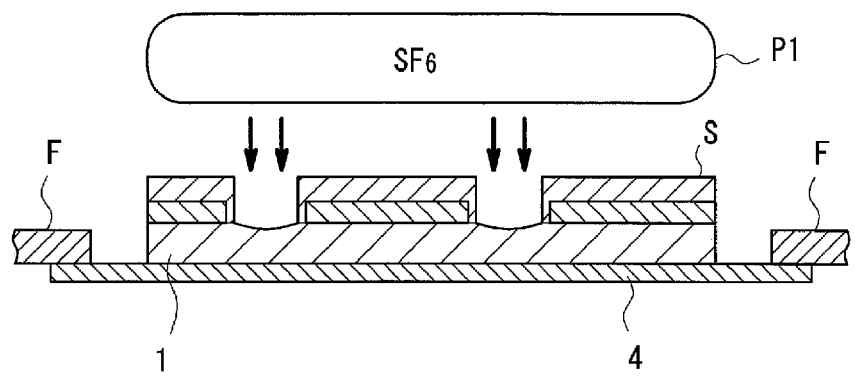
FIGS. 4(a) to 4(c) are schematic cross-sectional views illustrating the plasma dicing and plasma ashing steps in the first embodiment using the mask-integrated surface protective tape of the present invention. In the views, fragmentary
Figure 4B:
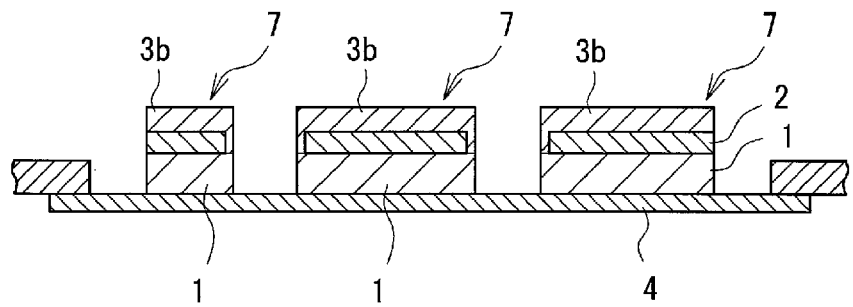
Figure 4C:
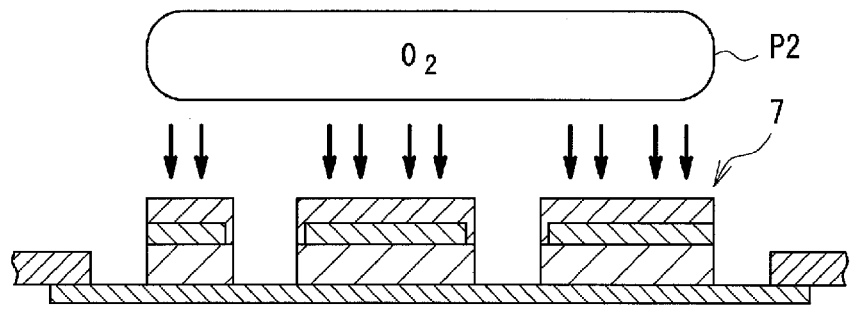

Then, a treatment with the plasma P1 of $SF_6$ gas is carried out from the surface S side, thereby to etch the semiconductor wafer 1 which is exposed at the street portion (see fragmentary FIG. 4(a)), and the semiconductor wafer is divided into individual chips 7, which results in singulation (see fragmentary FIG. 4(b)). After that, ashing with the plasma P2 of $O_2$ gas is carried out (see fragmentary FIG. 4(c)), thereby to remove the mask material layer 3b remaining on the surface S (see fragmentary FIG. 5(a)). Then, at last, the singulated chip 7 is knocked up by a pin M2, and is picked up by adsorption with a collet M3 (see fragmentary FIG. 5(b)).

Herein, a process of etching of Si of the semiconductor wafer with the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal of the mask material layer with the $O_2$ plasma is a method which is also used as plasma cleaner in the course of a semiconductor production process, and is also called as ashing (ash-making), which is one of means for removal of the organic substance. This method is carried out, in order to clean an organic substance deposit remaining on a semiconductor device surface.

Next, the materials used in the method described above are described. Note that the materials described below are those which can be preferably used in all of the mask-integrated surface protective tape of the present invention and therefore are not limited to the case of using the mask-integrated surface protective tape of the present invention in the above described method.

The semiconductor wafer 1 is a silicon wafer, on its one side, having the patterned face 2 on which the circuit or the like of the semiconductor device is formed. The patterned face 2 is a face on which the circuit or the like of the semiconductor device is formed, which has a street in a planar view.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property and the like in some cases are required. As the foregoing wafer-fixing tape 4, a tape similar to the surface protective tape 3a may be used. Further, use may be made of any of known dicing tapes used in a conventional plasma dicing method, which are generally called as a dicing tape. Further, the use can be also made of a dicing die-bonding tape, in which an adhesive for die-bonding is laminated between the temporary-adhesive layer and the substrate film, in order to make it easy to transit to the dicing die-bonding step after picking-up.

In order to carry out the plasma dicing and the plasma ashing, use can be made of a plasma-etching apparatus. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. When a high-frequency voltage is applied to the electrode for a high-frequency wave, plasma is generated between the gas-supplying electrode and the electrode for a high-frequency wave. Therefore, the resultant plasma is used. By circulating a refrigerant in a heat-producing electrode for high-frequency wave, it is possible to prevent a temperature elevation of the semiconductor wafer 1 due to the heat of this plasma.

In accordance with the method of producing the semiconductor chip (the method of processing the semiconductor wafer), any photolithographic step or the like becomes unnecessary, which is provided with a resist to be used in the conventional plasma dicing process, by giving a mask function in the plasma dicing to the surface protective tape protecting the patterned face 2. In particular, by using the surface protective tape, a technique becomes unnecessary, in which a high level of alignment, such as printing and transferring, is required for the mask formation. The mask-integrated surface protective tape can be easily laminated on the semiconductor wafer surface, and a mask can be easily formed by the laser equipment.

Further, the mask material layer 3b can be removed with $O_2$ plasma, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation. From these reasons, the facilities can be simplified, and process costs can be considerably suppressed.

Second Embodiment [FIG. 6]

This embodiment is different from the first embodiment in the point that the second embodiment contains a step of curing the mask material layer or the temporary-adhesive layer by irradiating the mask-integrated surface protective tape 3 with a radiation, such as an ultraviolet light or the like, prior to the step of peeling-off the surface protective tape 3a in the first embodiment. Other steps are the same as in the first embodiment.

Note, in the present invention, that not the temporary-adhesive layer, but the mask material layer is preferably cured.

Figure 2C:
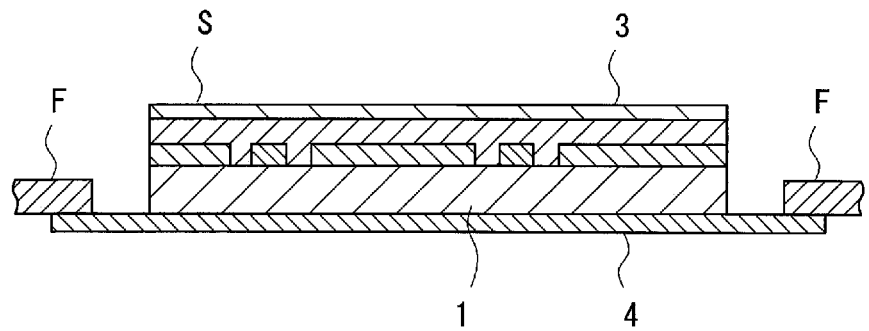
Figure 6A:
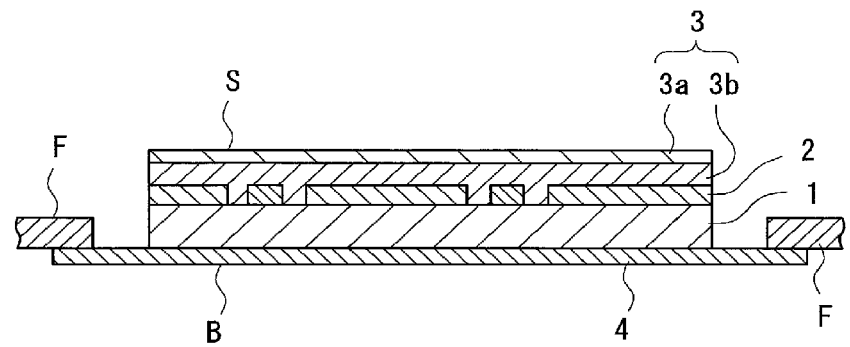
FIGS. 6(a) to 6(c) are schematic cross-sectional views illustrating a state before and after a treatment with an ultraviolet irradiation carrying out in the second embodiment of a method of producing a semiconductor chips using the mask-integrated surface protective tape of the present invention. In the views, fragmentary
Figure 6B:
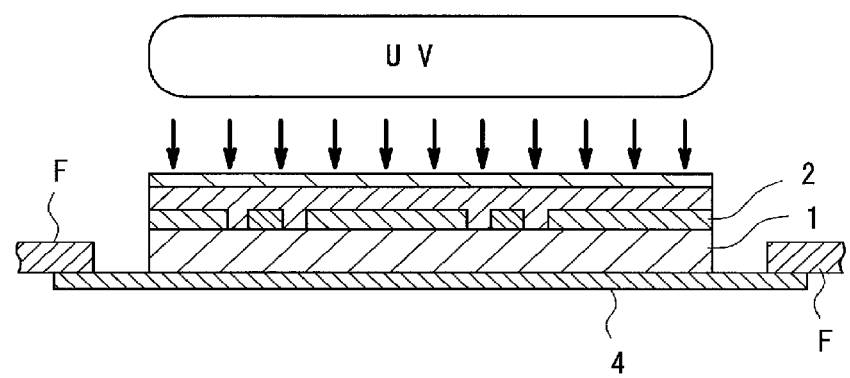
Figure 6C:
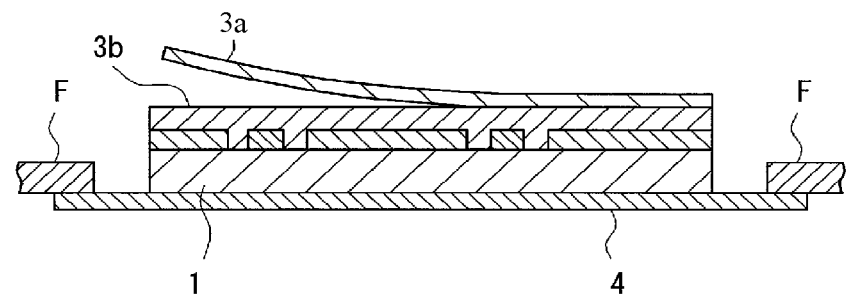

Specifically, after laminating the mask-integrated surface protective film 3 on the surface S side of the semiconductor wafer 1, and laminating the wafer fixing tape 4 on the ground backing-face B side of the semiconductor wafer 1, and supporting and fixing it to the ring flame F (see fragmentary FIG. 2(c) and fragmentary FIG. 6(a)). Then, an ultraviolet light UV is irradiated from the surface S side toward the mask-integrated surface protective tape 3 (see fragmentary FIG. 6(b)). Then, after curing the mask material layer 3b of the mask-integrated surface protective tape 3, the surface protective tape 3a is removed (see fragmentary FIG. 6(c)), whereby the mask material layer 3b is uncovered (see fragmentary FIG. 3(b)). Then, this step is transited to a step of cutting, with a laser L, a portion of the mask material layer 3b corresponding to the street.

Meanwhile, the ultraviolet irradiation is performed by irradiating an ultraviolet light entirely to the mask-integrated surface protective tape from the substrate film side so that the integrated irradiation dose gets to 500 mJ/cm². A high-pressure mercury lamp is preferably used for the ultraviolet irradiation.

In the mask-integrated surface protective tape that can be used in this embodiment, at variation with the mask-integrated surface protective tape 3 described in the first embodiment, a material which is capable of being cured with a radiation, such as an ultraviolet ray or the like, is used in the mask material layer 3b.

By curing the mask material layer 3b with the ultraviolet light or the like, peeling-off of the surface protective tape 3a from mask material layer 3b is made easily performed.

Each of the above-described embodiments is an example of the present invention and therefore the present invention is not limited to these embodiments. Accordingly, addition, deletion, modification and the like of a known process may be made in each process to the extent of no departure from the scope of the present invention.

EXAMPLES

The present invention will be described in more detail based on examples given below, but the invention is not meant to be limited by these.

Example 1

<Production of Mask-Integrated Surface Protective Tape>

An (meth)acrylic copolymer (mass-average molecular weight: 400,000, hydroxyl value: 0 mg KOH/g, acid value: 48.8 mg KOH/g, Tg: −23° C.) was synthesized by mixing 20 mol % of acrylic acid, 70 mol % of butyl acrylate and 10 mol % of methyl acrylate in the described molar ratio and subjecting to polymerization in an ethyl acetate solution.

To this (meth)acrylic copolymer solution, 2.0 parts by mass of TETRAD-X (manufactured by Mitsubishi Gas Chemical Company, Inc., epoxy-based curing agent) was blended as a curing agent with respect to 100 parts by mass of the copolymer to obtain a temporary-adhesive composition A.

1.0 mol % of methacrylic acid, 78 mol % of 2-ethylhexyl acrylate and 21 mol % of 2-hydroxyethyl acrylate were mixed in the described molar ratio. The mixture was subjected to polymerization in an ethyl acetate solution to obtain a solution of (meth)acrylic copolymer having a mass-average molecular weight of 700,000.

To the obtained copolymer, 2-methaclyroyloxyethyl isocyanate (trade name: KARENZ MOI, Showa Denko K.K.) was adjoined to obtain an ethylenically unsaturated group-containing (meth)acrylic copolymer (mass-average molecular weight: 700,000, double bonding amount: 0.90 meq/g, hydroxyl group value: 33.5 mg KOH/g, acid value: 5.5 mg KOH/g, Tg: −68° C.).

To 100 mass parts of this ethylenically unsaturated group-containing (meth)acrylic copolymer, 1.0 mass parts of COLONATE L (isocyanate-series curing agent, manufactured by Nippon Polyurethane Industry Co., Ltd.) as a curing agent, 2.0 mass parts of IRGACURE 184 (manufactured by BASF) as a photopolymerization initiation, and 0.75 mass parts of LA-F70 (ultraviolet absorber of triazine flame, manufactured by ADEKA K.K) as a ultraviolet absorber were blended to obtain a mask material layer-forming composition B.

The above-described temporary-adhesive composition A was coated on a peeling liner so that a thickness after drying got to 30 μm, and the formed temporary-adhesive layer 3ab was laminated on a substrate film 3aa (the surface roughness Rz of the side to be laminated to the temporary-adhesive layer was 0.5 μm) of a 100 μm-thick low density polyethylene (LDPE) film to obtain the surface protective film 3a having a thickness of 130 μm.

Further, the above-described mask material layer-forming composition B was coated on a peeling liner so that a thickness after drying got to 10 μm, thereby to form a mask material layer 3b. By laminating this mask material layer 3b on the surface of the temporary-adhesive layer 3ab (a layer formed of the temporary-adhesive composition A) which had been exposed by peeling the peeling liner from the above-described surface protective film 3a, an ultraviolet curable mask-integrated surface protective tape 3 having the surface roughness Rz of 1.0 μm at the side of the mask material layer 3b which does not have contact with an adherent, and having a total thickness of 140 μm was prepared.

That is, in the mask material layer of the mask-integrated surface protective tape of the present invention, a curing agent (COLONATE L) was in a state of being reacted with resin before curing, such as an ethylenically unsaturated group-containing (meth)acrylic copolymer and the like.

Meanwhile, in a case of having a temporary-adhesive layer, the surface roughness Rz at the side of the mask material layer which does not have contact with an adherent was adjusted to an objective value of the surface roughness by adjusting the surface roughness Rz of the temporary-adhesive layer at the side of laminating the mask material layer. On the other hand, in a case of having no temporary-adhesive layer, the surface roughness Rz at the side of the mask material layer which does not have contact with an adherent was adjusted to an objective value of the surface roughness by adjusting the surface roughness Rz of the substrate film at the side of laminating the mask material layer.

Herein, the surface roughness Rz was confirmed by measuring a surface roughness with a laser microscope.

<Production of Semiconductor Chip>

The above-obtained ultraviolet curable mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face) opposite to the surface on which the above-described mask-integrated surface protective tape was laminated, was ground using DGP8760 (trade name, manufactured by DISCO Corporation) until a thickness of the wafer got to 50 μm. The ground wafer was mounted on a dicing tape (wafer fixing tape) from the wafer backing-face side using RAD-2700F (trade name, manufactured by Lintec Corporation), and was supported and fixed to a ring flame (step (a)).

After the fixing, by irradiating an ultraviolet ray of 500 mJ/cm$^2$ from the ultraviolet curable mask-integrated surface protective tape side using a high pressure mercury lamp, an adhesive force between the mask material layer 3b and the surface protective tape 3a was decreased, and only the surface protective tape 3a was peeled while leaving only the mask material layer 3 on the wafer.

Next, the mask material on the scribe line was removed by a YAG laser having a wavelength of 355 nm or a $CO_2$ laser having a wavelength of 10800 nm to form an opening on the scribe line (step (b)).

After that, the silicon wafer was subjected to a plasma irradiation with a $SF_6$ gas as a plasma-generating gas from the mask material layer side at an etching rate of 15 μm/min for 5 minutes. By this plasma dicing, the wafer was cut and divided into individual chips (step (c)).

Next, the chips were subjected to ashing with an $O_2$ gas as a plasma-generating gas at an etching rate of 1.5 μm/min for 10 minutes thereby to remove the mask material layer 3b (step (d)).

After that, an ultraviolet ray was irradiated (irradiation dose: 200 mJ/cm$^2$) from the dicing tape side thereby to decrease an adhesive force of the dicing tape and chips were picked up.

Example 2

A mask-integrated surface protective tape was prepared in the same manner as in Example 1, except that the surface roughness Rz at the side of the mask material layer which did not have contact with an adherent was adjusted to 1.5 μm, and a semiconductor chip was produced in the same manner as in Example 1.

Example 3

A mask-integrated surface protective tape was prepared in the same manner as in Example 1, except that the surface roughness Rz at the side of the mask material layer which did not have contact with an adherent was adjusted to 0.2 μm, and a semiconductor chip was produced in the same manner as in Example 1.

Example 4

A mask-integrated surface protective tape was prepared in the same manner as in Example 1, except that the blend amount of LA-F70 (ultraviolet absorber of triazine skeleton, manufactured by ADEKA K.K) as a ultraviolet absorber for the mask material layer-forming composition B used in Example 1 was changed from 0.75 parts by mass to 1.5 parts by mass, and a semiconductor chip was produced in the same manner as in Example 1.

Example 5

A mask-integrated surface protective tape was prepared in the same manner as in Example 1, except that LA-F70 (ultraviolet absorber of triazine skeleton, manufactured by ADEKA K.K) as a ultraviolet absorber for the mask material layer-forming composition B used in Example 1 was changed to LA-31 (ultraviolet absorber of triazole skeleton, manufactured by ADEKA K.K) as a ultraviolet absorber, and a semiconductor chip was produced in the same manner as in Example 1.

Example 6

A mask-integrated surface protective tape was prepared in the same manner as in Example 1, except that LA-F70 (ultraviolet absorber of triazine skeleton, manufactured by ADEKA K.K) as a ultraviolet absorber for the mask material layer-forming composition B used in Example 1 was changed to LA-31 (ultraviolet absorber of triazole skeleton, manufactured by ADEKA K.K) as a ultraviolet absorber and the blend amount of the ultraviolet absorber was changed from 0.75 parts by mass to 0.5 parts by mass, and a semiconductor chip was produced in the same manner as in Example 1.

Example 7

The mask material layer-forming composition B used in Example 1 was coated, without providing the temporary-adhesive layer 3ab formed in Example 1, on a peeling liner so that a thickness after drying got to 10 μm, thereby to form a mask material layer 3b. By laminating this mask material layer 3b directly on the substrate film used in Example 1, an ultraviolet curable mask-integrated surface protective tape having a total thickness of 110 μm was prepared, and a semiconductor chip was produced in the same manner as in Example 1.

Meanwhile, the surface roughness Rz of the mask material layer at the side of having no contact with an adherent was adjusted to objective value of the surface roughness Rz in the same manner as in Example 1.

Example 8

A mask-integrated surface protective tape was prepared in the same manner as in Example 1, except that the mask material layer-forming composition B in Example 1 was replaced with an ultraviolet-absorbing polymer, and a semiconductor chip was produced in the same manner as in Example 1.

Meanwhile, as the ultraviolet-absorbing polymer, an equimass mixture of VANARESIN UVA-5080 and VANARESIN UVA-7075 (each manufactured by Shin-Nakamura Chemical Co., Ltd.) was used.

Comparative Example 1

A mask-integrated surface protective tape was prepared in the same manner as in Example 1, except that the surface roughness Rz at the side of the mask material layer which did not have contact with an adherent was adjusted to 2.0 μm, and a semiconductor chip was produced in the same manner as in Example 1.

Comparative Example 2

A mask-integrated surface protective tape was prepared in the same manner as in Example 1, except that the surface roughness Rz at the side of the mask material layer which did not have contact with an adherent was adjusted to 0.05 μm, and a semiconductor chip was produced in the same manner as in Example 1.

Herein, LA-F70 and LA-31 of the ultraviolet absorber (each manufactured by ADEKA K.K) and VANARESIN UVA-5080 and VANARESIN UVA-7075 of the ultraviolet absorbing polymer (each manufactured by Shin-Nakamura Chemical Co., Ltd.) have the following chemical structures.

{Formula 2}

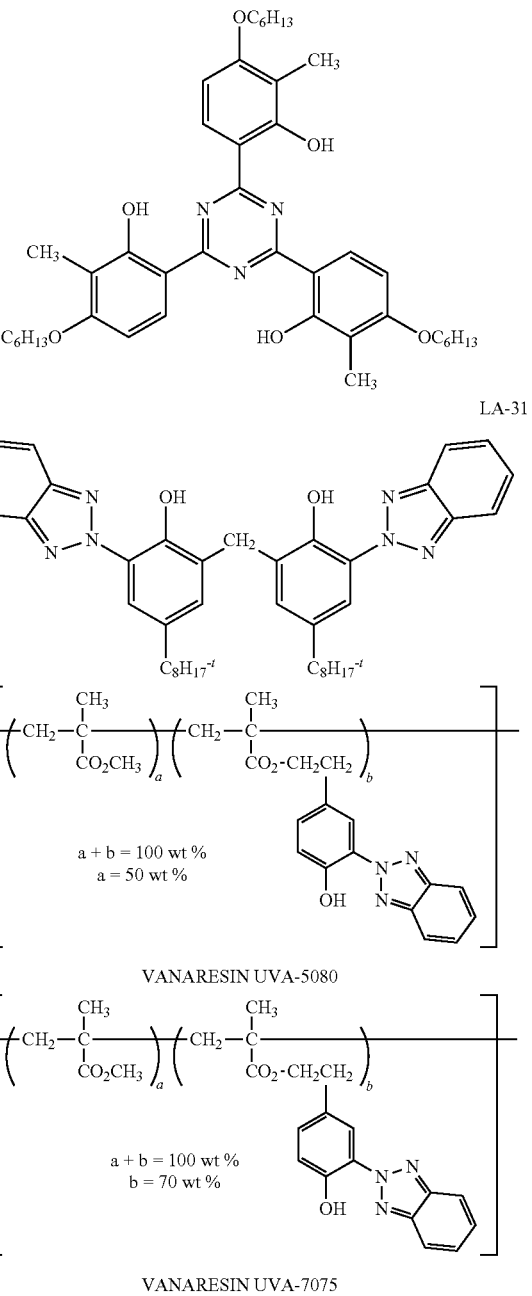

<Characteristics and Performance Evaluation>

The parallel ray absorption rate of each mask material layer 3b so obtained was measured and calculated as in the following test example 1.

Further, in Examples 1 to 6 and 8 and Comparative Examples 1 and 2, a peeling property evaluation of the surface protective tape 3a to be peeled was performed as in the following test example 2. In Example 7, a peeling property evaluation of the substrate film 3a to be peeled was performed as in the following test example 2.

Further, evaluations of both a cutting property at the street portion and a removal property of the mask material layer of each mask-integrated surface protective tape prepared in Examples 1 to 8 and Comparative Examples 1 and 2 were performed as in the following test examples 3 and 4.

[Test Example 1] Evaluation of Parallel Ray Absorption Rate of Mask Material Layer The parallel ray transmittance rate of the mask material layer at wavelengths of 355 nm and 10800 nm was measured by the following method.

The mask material layer was fixed to a jig and the transmittance at the wavelengths of 355 nm and 10800 nm was measured using an ultraviolet and visible spectrophotometer UV-1800 (manufactured by Shimadzu Corporation). The parallel ray absorption rate was calculated by using a higher value of two kinds of parallel ray transmittances at wavelengths of 355 nm and 10800 nm as a parallel ray transmittance in the following formula.

Meanwhile, the parallel ray transmittance rate of the mask material layer was a measured value of a measuring mask material sample prepared for having the same thickness the mask material layer of the mask-integrated surface protective tape.

Parallel ray absorption rate [%]=100−Parallel ray transmittance rate [%]

[Test Example 2] Peeling Property Evaluation of Surface Protective Tape or Substrate Film With respect to the mask-integrated surface protective tape after ultraviolet irradiation in the step (b) of the production steps of the above-described semiconductor chip, a separator (the surface protective tape or the substrate film) was peeled by hand. At the time of peeling, it was confirmed whether the mask material of the mask material layer was peeled from the temporary-adhesive layer or the substrate film and a peeling property was evaluated according to the following criterion.

—Criterion for Evaluation of Peeling Property of Surface Protective Tape or Substrate Film—

⊙: Only the surface protective tape or substrate film could be simply peeled with a weak force.
○: A strongish force was required for peeling, but only the surface protective tape or substrate film could be peeled.
x: The surface protective tape or substrate film could not be peeled.
Alternatively, the surface protective tape or substrate film was peeled together with the mask material layer.

[Test Example 3] Cutting Property of Wafer Street Portion with Laser Irradiation In the above-described step (b) of the above-described production steps of the semiconductor chip, by irradiating a YAG laser of 355 nm to the mask material layer in each of Examples and Comparative Examples, a portion of the mask material layer corresponding to the street was removed, and a cutting property at the time of opening of the semiconductor wafer was evaluated according to the following criterion.

Specifically, a laser light was irradiated from the mask material layer side using a Galvanometer scanner by focusing the third harmonic wave of YAG laser (355 nm) having an average output of 2.5 W and a cyclic frequency of 1 kHz on a silicon wafer surface to 25 μm diameter with a f θ lens.

The laser irradiation was scanned at a rate of 2.5 mm/sec and a portion of the mask material layer corresponding to a street was removed by repeating the laser irradiation once per line, thereby to evaluate a cutting property at the time of opening the street of the semiconductor wafer.

—Evaluation Criterion of Cutting Property of Wafer Street Portion by Laser Irradiation—

⊙: Opening of the street was possible and a residue of the mask material layer was not formed.
○: Opening of the street was possible but a residue of the mask material layer was formed.
x: The mask material layer could not be removed, so that opening of the street was impossible.

[Test Example 4] Removal Property Evaluation of Mask Material Layer by $O_2$ Plasma Ashing In the step (d) of the above-described production steps of the semiconductor chip, presence or absence of the residue of the mask material of the mask material layer after $O_2$ plasma ashing (ashing for 10 minutes at the etching rate of 1.5 μm/min) in each of Examples and Comparative Examples was examined in 3 dimensional information (magnifying power of 400 times) in a range of 640 μm in horizontal size by 480 μm in vertical size of the face using a laser microscope (trade name: VK-X100, manufactured by Keyence Corporation). Specifically, presence or absence of the residue was confirmed with respect to 5 points consisting of a center of the circle, 4 points at the same distance from the center of the circle, the 4 points lying on 2 lines which are at right angle to one another at the center of the circle (each within a range of 640 μm in horizontal size by 480 μm in vertical size) on the surface of the semiconductor wafer.

—Criterion for Removal Property Evaluation of Mask Material Layer—

○: No residue of the mask material layer was observed (since there is no residue, this is expressed as "absence" in the Tables 1 and 2).
x: A residue of the mask material layer was apparently observed (since there is a residue, this is expressed as "presence" in the Tables 1 and 2).

The results of the Test Examples 1 to 4 are shown in Tables 1 and 2.

Herein, the expression "-" in the column of Example 8 means that no ultraviolet absorber was blended.

Further, the expression "-" in the column of Comparative Example 2 means that in evaluation of "Cutting property of wafer street portion with laser irradiation", the mask material layer was peeled at the time of peeling the separator (surface protective tape), so that the evaluation could not be conducted.

On the other hand, the expression "-" in "Removal property evaluation of mask material layer by $O_2$ plasma ashing" means that since evaluation of "Cutting property of wafer street portion with laser irradiation" could not be conducted, the evaluation in Test Example 4 was not conducted.

TABLE 1

|  | Ex. 1 | Ex. 2 | Ex. 3 | Ex. 4 | Ex. 5 | Ex. 6 | Ex. 7 | Ex. 8 |
| --- | --- | --- | --- | --- | --- | --- | --- | --- |
| Surface roughness of mask material Rz [μm] | 1.0 | 1.5 | 0.2 | 1.0 | 1.0 | 1.0 | 1.0 | 1.0 |
| Ultraviolet absorber | LA-F70 | LA-F70 | LA-F70 | LA-F70 | LA-31 | LA-31 | LA-F70 | — |
| Blended ultraviolet absorber mass part | 0.75 | 0.75 | 0.75 | 1.5 | 0.75 | 0.5 | 0.75 | — |
| Presence or absence of temporary-adhesive layer | Presence | Presence | Presence | Presence | Presence | Presence | Absence | Presence |
| Ultraviolet-absorbing polymer | Absence | Absence | Absence | Absence | Absence | Absence | Absence | Presence |
| Mask material peeling from substrate | Not Occur | Not Occur | Not Occur | Not Occur | Not Occur | Not Occur | Not Occur | Not Occur |
| Parallel ray absorbance rate [%] | 87 | 52 | 92 | 99 | 78 | 65 | 88 | 75 |
| Cutting property of wafer street portion with laser irradiation | ◎ | ◎ | ◎ | ◎ | ◎ | ◎ | ◎ | ◎ |
| Removal property of mask material layer by $O_2$ plasma ashing | ○ | ○ | ○ | ○ | ○ | ○ | ○ | ○ |

Remarks:
'Ex' means Example according to this invention.

TABLE 2

|  | CEx 1 | CEx 2 |
| --- | --- | --- |
| Surface roughness of mask material Rz [μm] | 2.0 | 0.05 |
| Ultraviolet absorber | LA-F70 | LA-F70 |
| Blended ultraviolet absorber mass part | 0.75 | 0.75 |
| Presence or absence of temporary-adhesive layer | Presence | Presence |
| Ultraviolet-absorbing polymer | Absence | Absence |
| Mask material peeling from substrate | Not Occur | Occurred |
| Parallel ray absorbance rate [%] | 30 | 94 |
| Cutting property of wafer street portion with laser irradiation | x | — |
| Removal property of mask material layer by $O_2$ plasma ashing | ○ | — |

Remarks:
'CEx' means Comparative Example.

From the results of each Test Example in the above-described Examples 1 to 8 and Comparative Examples 1 and 2, it is found that a mask can be formed simply without causing any adhesive deposit by using the mask-integrated surface protective tape of the present invention at the time of processing a semiconductor wafer to produce a semiconductor chip, and by laminating the mask-integrated surface protective tape 3 on a patterned surface of the semiconductor wafer, and only by peeling the surface protective tape 3*a*, or in a case of having the mask material layer 3*b* directly on the substrate film, only by peeling the substrate film 3*a*, from the laminated mask-integrated surface protective tape 3.

Furthermore, it was found that an opening of the street of the semiconductor wafer was formed properly with a laser irradiation by using the mask-integrated surface protective tape of the present invention, and further the mask material layer 3*b* could be removed with more certainty by $O_2$ plasma, so that occurrence of a defective chip could be highly suppressed.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Semiconductor wafer
2 Patterned face
3 Mask-integrated surface protective tape
   3*a* Surface protective tape (Substrate film and Temporary-adhesive layer) or Substrate film
      3*aa* Substrate film of surface protective tape
      3*ab* Temporary-adhesive layer of surface protective tape
   3*b* Mask material layer
4 Wafer fixing tape
   4*a* Temporary-adhesive layer or Adhesive layer
   4*b* Substrate film
7 Chip (Also referred to as a semiconductor chip.)
S Surface
B Backing-face
M1 Wafer-grinding apparatus
M2 Pin
M3 Collet
F Ring flame
L Laser
P1 Plasma of $SF_6$ gas
P2 Plasma of $O_2$ gas

The invention claimed is:

1. A mask material for plasma dicing, which is used in a plasma step after forming an opening by laser cutting, wherein the surface roughness Rz of the mask material at the surface side that does not touch with an adherend is from 0.1 m to 1.5 m, the mask material contains a (meth)acrylic polymer having an ultraviolet-absorbing skeleton selected from at least any one of a benzotriazole skeleton, a benzophenone skeleton and a triazine skeleton in the side chain, and a parallel ray absorption rate of a mask material layer composed of the mask material in a wavelength of 355 nm to 10800 nm of said laser by which the mask material is removed, is 75% or more.

2. A mask-integrated surface protective tape, which is used in the production of a semiconductor chip, comprising at least: a substrate film, and a mask material layer provided on the substrate film, which is subjected to a plasma step after forming an opening by laser cutting, wherein the surface roughness Rz of the mask material layer at the surface side that does not touch with an adherend is from 0.1 m to 1.5 m, the mask material layer contains a (meth)acrylic polymer having an ultraviolet-absorbing skeleton selected from at least any one of a benzotriazole skeleton, a benzophenone skeleton and a triazine skeleton in the side chain, the mask material layer is provided directly on the substrate film, or is provided on the substrate film through a temporary-adhesive layer, a parallel ray absorption rate of the mask material layer in a wavelength of 355 nm to 10800 nm of said laser by which the mask material layer is removed, is 75% or more, and a content of an ultraviolet-absorbing constituent in a temporary-adhesive layer is an amount to be less than 50% in terms of said parallel ray absorption rate in a wavelength region of 355 nm of the temporary-adhesive layer, or the temporary-adhesive layer does not contain the ultraviolet-absorbing constituent.

3. The mask-integrated surface protective tape according to claim 2,
    wherein the mask material layer comprises a resin and at least one kind of ultraviolet absorber, and
    wherein the content of the ultraviolet absorber in the mask material layer is from 0.5 to 1.5 parts by mass with respect to 100 parts by mass of the resin.

4. The mask-integrated surface protective tape according to claim 2, wherein the mask material layer is radiation-curable.

5. The mask-integrated surface protective tape according to claim 2,
    wherein the mask material layer is provided on the substrate film through a temporary-adhesive layer, and
    wherein the temporary-adhesive that constitutes the temporary-adhesive layer is a pressure-sensitive type temporary-adhesive.

6. The mask-integrated surface protective tape according to claim 2, wherein the substrate film comprises at least a polyolefin-series resin layer.

7. A method of producing a semiconductor chip having at least a substrate film and a mask material layer provided on the substrate film,
    wherein surface roughness Rz of the mask material layer at the surface side that does not touch with an adherend is from 0.1 μm to 1.5 μm, and
    wherein the method of producing a semiconductor chip comprises the following steps (a) to (d):

[Steps]
(a) a step of, in the state of having laminated the mask-integrated surface protective tape according to claim 2 on the side of a patterned surface of a semiconductor wafer, grinding the backing-face of the semiconductor wafer; laminating a wafer fixing tape on the backing-face side of the ground semiconductor wafer; and supporting and fixing the wafer to a ring flame;
(b) a step of, after peeling at least the substrate film from the mask-integrated surface protective tape thereby to expose the mask material layer on top, forming an opening by cutting a portion of the mask material layer corresponding to a street of the semiconductor wafer with a laser;
(c) a plasma-dicing step of segmentalizing the semiconductor wafer on the street by a SF6 plasma, and thereby for singulating the semiconductor wafer into semiconductor chips; and
(d) a step of removing the mask material layer.

8. The method of producing a semiconductor chip according to claim 7,
    wherein the mask material layer is provided directly on the substrate film or provided on the substrate film through a temporary-adhesive layer, and
    wherein in order to expose the mask material layer on top in the step (b), the substrate film is peeled or both the substrate film and the temporary adhesive layer are integrally peeled.

* * * * *